US008441084B2

(12) United States Patent
Cai et al.

(10) Patent No.: US 8,441,084 B2
(45) Date of Patent: May 14, 2013

(54) HORIZONTAL POLYSILICON-GERMANIUM HETEROJUNCTION BIPOLAR TRANSISTOR

(75) Inventors: Jin Cai, Cortlandt Manor, NY (US);
Kevin K. Chan, Staten Island, NY (US);
Wilfried E. Haensch, Somers, NY (US);
Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 13/048,342

(22) Filed: Mar. 15, 2011

(65) Prior Publication Data

US 2012/0235151 A1    Sep. 20, 2012

(51) Int. Cl.
*H01L 29/66* (2006.01)
*H01L 29/04* (2006.01)

(52) U.S. Cl.
USPC ........... 257/423; 257/183; 257/197; 257/557; 257/E29.033; 257/E27.023

(58) Field of Classification Search .............. 257/47, 257/183, 187, 196, 197, 198, 511, 517, 525, 257/526, 557, 575, 592, E29.03, E29.031, 257/E29.033, 12, 19, 20, 51, 192, 194, 200, 257/272, 273, 423, 477, 564, 565, E51.01, 257/E31.067, E27.023, E29.034, E21.371, 257/E21.373, E21.387
See application file for complete search history.

(56) References Cited

U.S. PATENT DOCUMENTS

| | | | | |
|---|---|---|---|---|
| 4,119,994 A | * | 10/1978 | Jain et al. | 257/198 |
| 4,716,445 A | * | 12/1987 | Sone | 257/191 |
| 5,962,880 A | * | 10/1999 | Oda et al. | 257/198 |
| 6,316,321 B1 | * | 11/2001 | Lin et al. | 438/305 |
| 6,399,993 B1 | | 6/2002 | Ohnishi et al. | |
| 6,573,188 B1 | | 6/2003 | Lai et al. | |
| 6,897,545 B2 | * | 5/2005 | Menut et al. | 257/575 |
| 6,949,764 B2 | * | 9/2005 | Ning | 257/47 |
| 6,974,977 B2 | * | 12/2005 | Washio et al. | 257/197 |
| 7,119,416 B1 | * | 10/2006 | Adam et al. | 257/592 |

(Continued)

OTHER PUBLICATIONS

Nii et al. A Novel Lateral bipolar Transistor with 67 GHz fmax on Thin-Film SOI for RF Analog Applications. IEEE Transactions on Electron Devices, col. 47, No. 7, Jul. 2000, pp. 1536-1541.*

(Continued)

*Primary Examiner* — Colleen Matthews
*Assistant Examiner* — Galina Yushina
(74) *Attorney, Agent, or Firm* — Scully, Scott, Murphy & Presser, P.C.; Louis J. Percello, Esq.

(57) ABSTRACT

A horizontal heterojunction bipolar transistor (HBT) includes doped single crystalline Ge having a doping of the first conductivity type as the base having an energy bandgap of about 0.66 eV, and doped polysilicon having a doping of a second conductivity type as a wide-gap-emitter having an energy bandgap of about 1.12 eV. In one embodiment, doped polysilicon having a doping of the second conductivity type is employed as the collector. In other embodiments, a single crystalline Ge having a doping of the second conductivity type is employed as the collector. In such embodiments, because the base and the collector include the same semiconductor material, i.e., Ge, having the same lattice constant, there is no lattice mismatch issue between the collector and the base. In both embodiments, because the emitter is polycrystalline and the base is single crystalline, there is no lattice mismatch issue between the base and the emitter.

20 Claims, 19 Drawing Sheets

U.S. PATENT DOCUMENTS

| | | | |
|---|---|---|---|
| 7,538,373 B2* | 5/2009 | Ellis-Monaghan et al. | 257/292 |
| 7,598,539 B2* | 10/2009 | Wilhelm | 257/197 |
| 7,888,745 B2* | 2/2011 | Khater et al. | 257/370 |
| 2003/0122154 A1* | 7/2003 | Babcock et al. | 257/197 |
| 2005/0110044 A1* | 5/2005 | Fan et al. | 257/197 |
| 2007/0298578 A1* | 12/2007 | Khater et al. | 438/322 |
| 2008/0217742 A1 | 9/2008 | Johnson et al. | |
| 2008/0261371 A1* | 10/2008 | Ho et al. | 438/311 |
| 2012/0032303 A1* | 2/2012 | Elkareh et al. | 257/587 |
| 2012/0139009 A1* | 6/2012 | Ning et al. | 257/197 |

OTHER PUBLICATIONS

Harame, D. L. et al., "Si/SiGe Epitaxial-Base Transistors—Part I: Materials, Physics, and Circuits" IEEE Transactions on Electron Devices (1995) pp. 455-468, vol. 42(3).

Deixler, P. et al., "Explorations for High Performance SiGe-Heterojunction Bipolar Transistor Integration" Proceedings of BCTM (2001) pp. 30-33.

Office Action dated Jul. 27, 2012, received in a related U.S. Patent Application, namely U.S. Appl. No. 13/048,366.

\* cited by examiner

HORIZONTAL POLYSILICON-GERMANIUM HETEROJUNCTION BIPOLAR TRANSISTOR

RELATED APPLICATIONS

The present application is related to co-assigned and co-pending U.S. application Ser. No. 13/048,366 filed on Mar. 15, 2012.

BACKGROUND

The present disclosure relates to semiconductor devices, and particularly to horizontal polysilicon-germanium heterojunction bipolar transistors and methods of manufacturing the same.

The collector current of a bipolar transistor is a function of the energy bandgap of the base region material. For a regular silicon base bipolar transistor, it takes an emitter-base bias of about 0.92 V to obtain a collector current density of 10 mA/$\mu$m$^2$. It is desirable to be able to reduce the voltage needed to drive a bipolar transistor.

The state of art SiGe-base bipolar transistors have silicon in the collector, a SiGe alloy in the base, and polysilicon as emitter. The distribution of Ge across the SiGe base region can be relatively uniform, or can be graded with higher Ge concentration near the collector end and lower, or zero, Ge concentration at the emitter end.

An example of the graded Ge distribution across the base region with zero Ge concentration at the emitter end can be found in the paper by D. L. Harame et al., "Si/SiGe epitaxial-base transistors—Part I: materials, physics, and circuits," IEEE Transactions on Electron Devices, vol. 42, p. 455, 1995. The SiGe base region is single crystalline, and is grown epitaxially on top of a single crystalline silicon collector layer. With zero or relatively low Ge concentration at the emitter end, there is little energy bandgap difference between the emitter and the base at the emitter-base junction. Thus, this transistor is not a wide-gap-emitter heterojunction bipolar transistor.

An example of a SiGe-base bipolar transistor having relatively uniform Ge distribution across the base region can be found in the paper by P. Deixler et al., "Explorations for high performance SiGe-heterojunction bipolar transistor integration," Proceedings of BCTM, p. 30, 2001. The SiGe base region is single crystalline, and is grown epitaxially on top of a single crystalline silicon collector layer. With the Ge distribution that is relatively uniform across the base, the energy bandgap of the base region is smaller than the energy bandgap of the emitter at the emitter-base junction. While this is a wide-gap-emitter heterojunction bipolar transistor, the Ge concentration in this prior art is only 15%, resulting in an energy bandgap of about 1.0 eV. Further increase in the Ge concentration in the SiGe alloy in the base region is not possible because Ge concentration greater than 15% in a SiGe alloy destroys epitaxial alignment between the base and the collector due to excessive lattice mismatch between the underlying silicon material and the SiGe alloy. In other words, to avoid defects being generated in the SiGe-base region, the Ge concentration has to stay below some limit, i.e., at about 15% Ge or less.

BRIEF SUMMARY

In the present disclosure, a horizontal heterojunction bipolar transistor (HBT) includes doped single crystalline Ge having a doping of the first conductivity type as the base having an energy bandgap of about 0.66 eV, and doped polysilicon having a doping of a second conductivity type as a wide-gap-emitter having an energy bandgap of about 1.12 eV. In one embodiment, doped polysilicon having a doping of the second conductivity type is employed as the collector. In other embodiments, a single crystalline Ge having a doping of the second conductivity type is employed as the collector. In such embodiments, because the base and the collector include the same semiconductor material, i.e., Ge, having the same lattice constant, there is no lattice mismatch issue between the collector and the base. In both embodiments, because the emitter is polycrystalline and the base is single crystalline, there is no lattice mismatch issue between the base and the emitter. The small band gap of the base enables reduction of the emitter-base bias by a factor of about 2 compared to a regular silicon-base bipolar transistor.

The horizontal heterojunction bipolar transistor structures can be built using a germanium-on-insulator (GOI) substrate. A doped polysilicon collector contact portion can be formed in some embodiments. An npn horizontal HBT or a pnp horizontal HBT can be formed depending on the selection of the first conductivity type and the second conductivity type.

According to an aspect of the present disclosure, a heterojunction bipolar transistor (HBT) structure is provided, which includes: a substrate including a buried insulator layer; a base contacting a top surface of the buried insulator layer and including single crystalline germanium having a doping of a first conductivity type; and an emitter contacting the top surface of the buried insulator layer and laterally contacting the base and including a doped polysilicon having a doping of a second conductivity type that is the opposite of the first conductivity type.

According to an another aspect of the present disclosure, a method of forming a heterojunction bipolar transistor is provided, which includes: providing a germanium-on-insulator (GOI) substrate including a buried insulator layer and a doped germanium layer having a doping of a first conductivity type; forming an extrinsic base including a polycrystalline semiconductor material having a doping of the first conductivity type over a portion of the doped germanium layer; removing a portion of the doped germanium layer in an area not covered by the extrinsic base, wherein a base is formed from a remaining portion of the doped germanium layer underneath the extrinsic base; and forming an emitter including doped polysilicon having a doping of a second conductivity type that is the opposite of the first conductivity type directly on a top surface of the buried insulator layer and a sidewall of the base.

DETAILED DESCRIPTION

Figure 1:
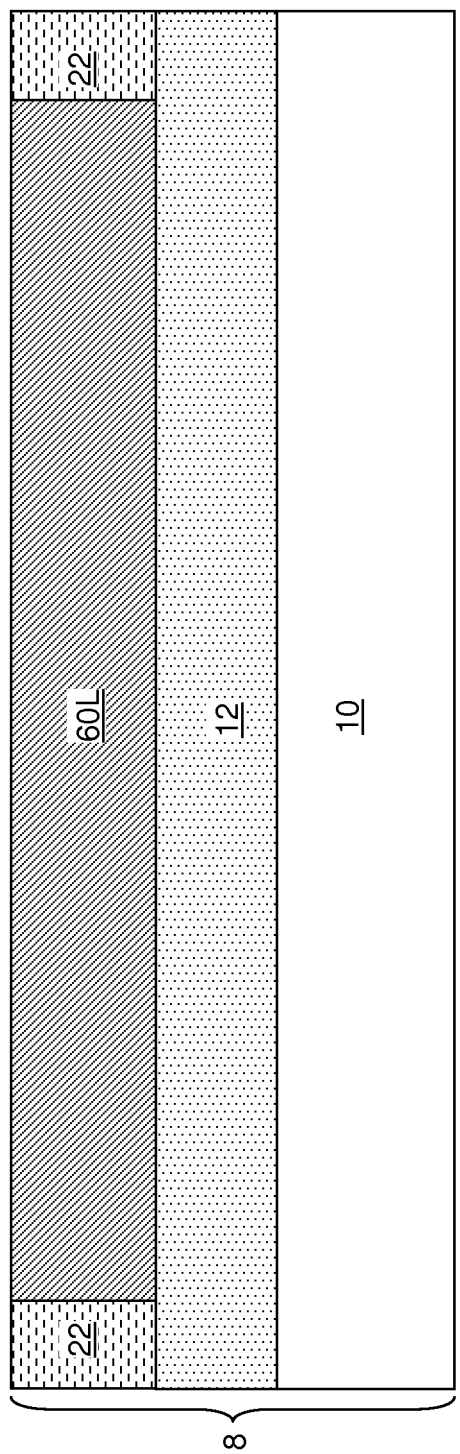
FIG. 1 is a vertical cross-sectional view of a first exemplary structure according to a first embodiment of the present disclosure after formation of a shallow trench isolation structure in a top germanium layer in a germanium-on-insulator (GOI) substrate.

As discussed above, the present disclosure relates to horizontal polysilicon-germanium heterojunction bipolar transistors and methods of manufacturing the same, which are now described in more detail by referring to the accompanying drawings. Like and corresponding elements are referred to by like reference numerals in the drawings. The drawings are not necessarily drawn to scale.

Referring to FIG. 1, a first exemplary structure according to a first embodiment of the present disclosure includes a germanium-on-insulator (GOI) substrate 8. The GOI substrate includes a handle substrate 10, a buried insulator layer 12, and a top germanium layer 60L having single crystalline germanium. The handle substrate 10 can include a semiconductor material, a dielectric material, and/or a conductive material. If the handle substrate 10 includes a semiconductor material, the handle substrate 10 can be a single crystalline silicon layer, a polysilicon layer, a single crystalline germanium layer, a polycrystalline germanium layer, a single crystalline silicon-germanium alloy layer, a polysilicon-germanium alloy layer, or a combination thereof.

The buried insulator layer 12 includes a dielectric material such as silicon oxide, silicon nitride, silicon oxynitride, germanium oxide, germanium nitride, germanium oxynitride, or a combination thereof. The thickness of the buried insulator layer 12 can be from 30 nm to 3,000 nm, and typically from 100 nm to 500 nm, although lesser and greater thicknesses can also be employed.

The top germanium layer 60L is a doped single crystalline germanium layer that includes single crystalline germanium having a doping of a first conductivity type, which can be p-type or n-type. The top germanium layer 60L can be provided as an intrinsic single crystalline germanium layer and is subsequently doped with dopants of the first conductivity type, or can be provided as a doped single crystalline germanium layer having a doping of the first conductivity type. The top germanium layer 60L has dopants of the first conductivity type at a dopant concentration from $1.0 \times 10^{16}/cm^3$ to $2.0 \times 10^{20}/cm^3$, and typically from $1.0 \times 10^{17}/cm^3$ to $1.0 \times 10^{20}/cm^3$, although lesser and greater dopant concentrations can also be employed. The thickness of the top germanium layer 60L can be typically from 20 nm to 600 nm, and typically from 50 nm to 200 nm, although lesser and greater thicknesses can also be employed.

A shallow trench isolation structure 22 is formed, for example, by forming trenches in the top germanium layer 60L and filling the trenches with a dielectric material. The dielectric material of the shallow trench isolation structure 22 can be, for example, silicon oxide, silicon nitride, and/or silicon oxynitride. The dielectric material of the shallow trench isolation structure 22 can be deposited, for example, by chemical vapor deposition as known in the art. Excess dielectric material above the top surface of the top germanium layer 60L is removed, for example, by chemical mechanical planarization (CMP). The shallow trench isolation structure 22 extends from the top surface of the top germanium layer 60L and at least to the top surface of the buried insulator layer 12, and laterally surrounds a portion of the top germanium layer 60L.

Figure 2:
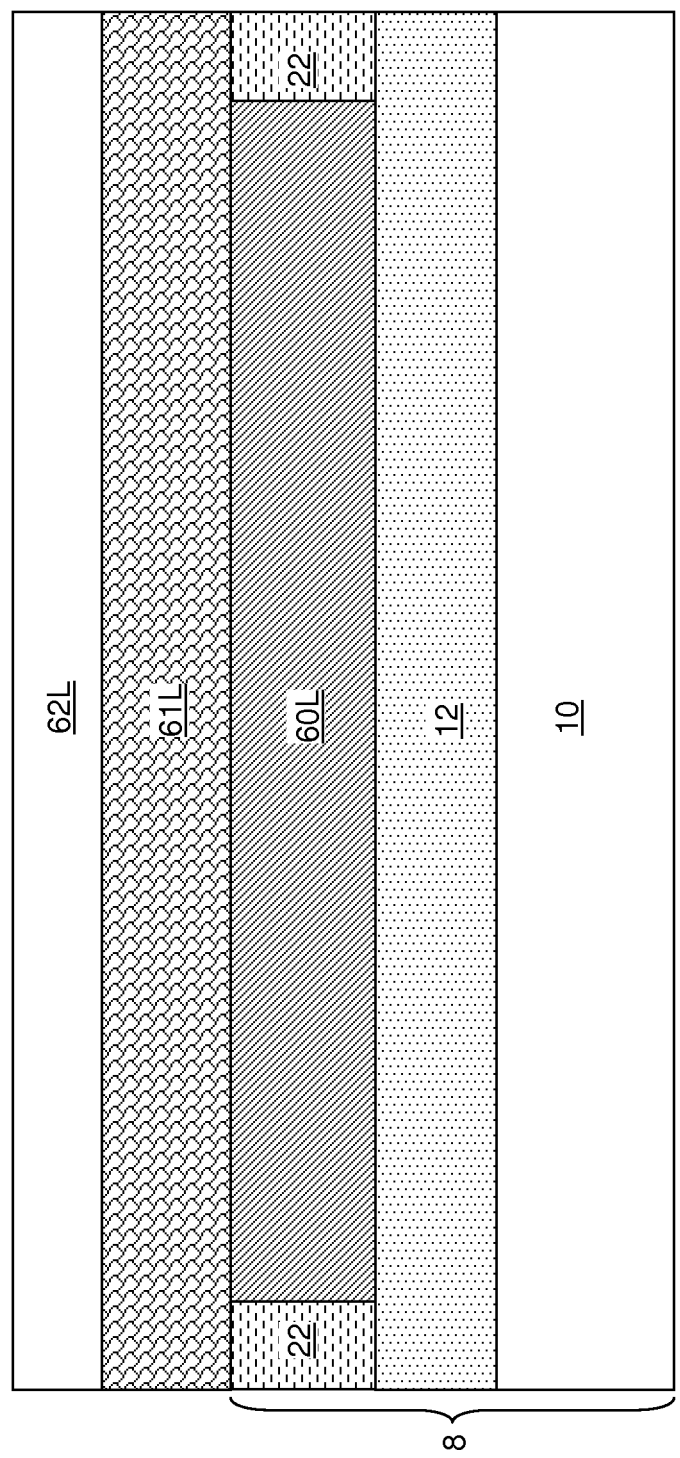
FIG. 2 is a vertical cross-sectional view of the first exemplary structure according to the first embodiment of the present disclosure after formation of an extrinsic base layer and an extrinsic base cap layer.

Referring to FIG. 2, an extrinsic base layer 61L and an extrinsic base cap layer 62L are deposited over the substrate 8. The extrinsic base layer 61L is deposited as a blanket layer having a uniform thickness directly on the top surface of the substrate 8, for example, by chemical vapor deposition. The extrinsic base layer 61L includes a doped polycrystalline semiconductor material having a doping of the first conductivity type. Thus, if the top germanium layer 60L has a doping of p-type, the extrinsic base layer 61L has a doping of p-type. Conversely, if the top germanium layer 60L has a doping of n-type, the extrinsic base layer 61L has a doping of n-type. The doped polycrystalline semiconductor material of the extrinsic base layer 61 can be, for example, doped polysilicon, doped polycrystalline germanium, or a doped polysilicon-germanium alloy. The thickness of the extrinsic base layer 61L can be from 20 nm to 300 nm, and typically from 50 nm to 150 nm, although lesser and greater thicknesses can also be employed.

The extrinsic base cap layer 62L is deposited as a blanket layer having a uniform thickness directly on the top surface of the extrinsic base layer 61L, for example, by chemical vapor deposition. The extrinsic base cap layer 61L includes a dielectric material such as silicon oxide, silicon nitride, and/or silicon oxynitride. The thickness of the extrinsic base cap layer 62L can be from 15 nm to 150 nm, and typically from 30 nm to 100 nm, although lesser and greater thicknesses can also be employed.

Figure 3:
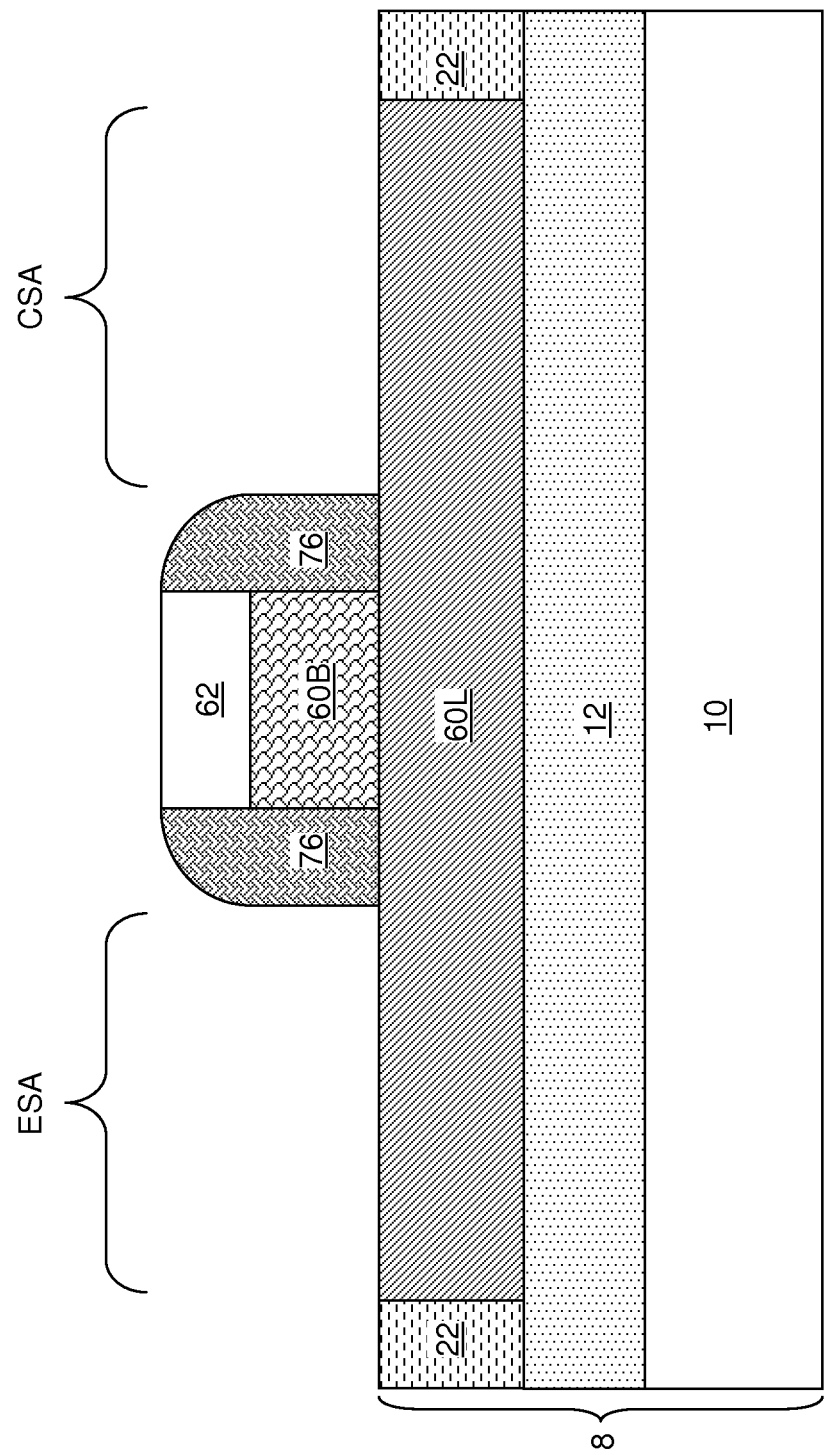
FIG. 3 is a vertical cross-sectional view of the first exemplary structure according to the first embodiment of the present disclosure after formation of an extrinsic base and an extrinsic base cap and a dielectric spacer.

Referring to FIG. 3, the stack of the extrinsic base cap layer 62L and the extrinsic base layer 61L is patterned to form a stack of an extrinsic base 60B and an extrinsic base cap 62. For example, a block level photoresist (not shown) can be applied over the stack of the extrinsic base layer 61L and the extrinsic bade cap layer 62L. The block level photoresist is lithographically patterned to cover a center portion of the top germanium layer 60L within the region laterally surrounded by the shallow trench isolation structure 22. An anisotropic etch can be employed to remove the portions of the extrinsic base cap layer 62L and the portions of the extrinsic base layer 61L that are not covered by the patterned block level photoresist. A remaining portion of the extrinsic base cap layer 62L after the anisotropic etch forms an extrinsic base cap 62, and a remaining portion of the extrinsic base layer 61L after the anisotropic etch forms an extrinsic base 60B. The sidewalls of the extrinsic base 60B and the sidewalls of the extrinsic base cap 62 are substantially vertically coincident, i.e., substantially coincident when viewed in a vertical direction. The lateral offset between the sidewalls of the extrinsic base 60B and the sidewalls of the extrinsic base cap 62 is "substantially" vertically coincident if the lateral offset is unintentional and is determined by process variability inherent in etch processes. Alternately, the sidewalls of the extrinsic base 60B and the sidewalls of the extrinsic base cap 62 may be intentionally laterally offset relative to one another to enhance device performance as needed. The block level photoresist is subsequently removed, for example, by ashing.

A dielectric spacer 76 is formed on the sidewalls of the stack of the extrinsic base 60B and the extrinsic base cap 62. The dielectric spacer 76 can be formed by deposition of a conformal dielectric material layer and an anisotropic etch that removes horizontal portions of the conformal dielectric material layer. The remaining vertical portions of the conformal dielectric material layer after the anisotropic etch form the dielectric spacer 76, which laterally surrounds the stack of the extrinsic base 60B and the extrinsic base cap 62. The dielectric spacer 76 includes a dielectric material such as silicon oxide, silicon nitride, silicon oxynitride, or a combination thereof. The thickness of the dielectric spacer 76, as measured laterally at a bottom portion that contacts the top germanium layer 60L, can be from 10 nm to 100 nm, although lesser and greater thicknesses can also be employed.

The combination of the stack of the extrinsic base 60B and the extrinsic base cap 62 and the dielectric spacer 76 overlies a center portion of the top germanium layer 60L that is laterally surrounded by the shallow trench isolation structure 22. An emitter side area ESA, in which a first portion of the top surface of the top germanium layer 60L is expose, is formed on one side of the combination of the stack of the extrinsic base 60B and the extrinsic base cap 62 and the dielectric spacer 76, and a collector side area CSA, in which a second portion of the top surface of the top germanium layer 60L is exposed, is formed on the other side of the combination of the stack of the extrinsic base 60B and the extrinsic base cap 62 and the dielectric spacer 76.

Figure 4:
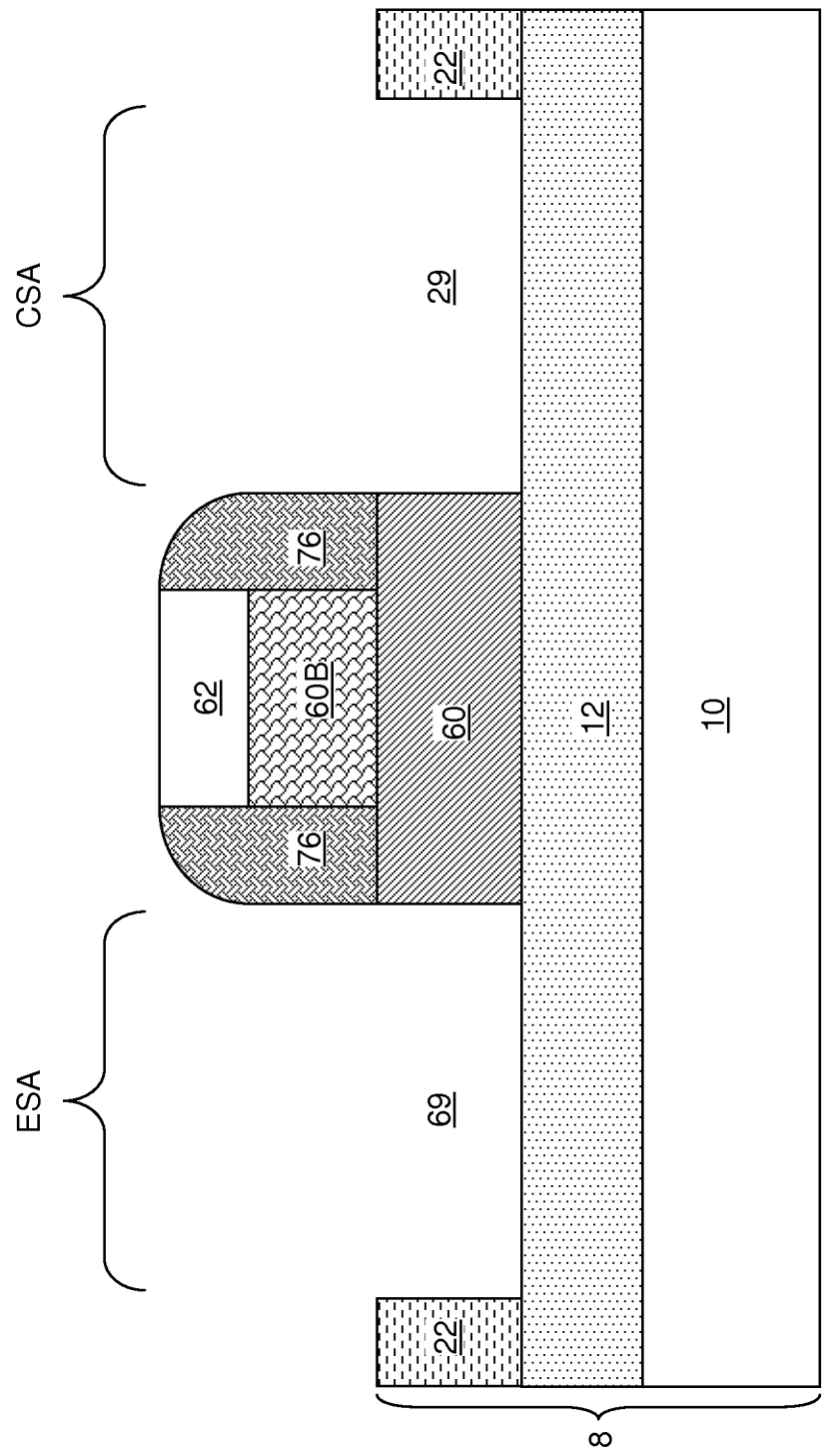
FIG. 4 is a vertical cross-sectional view of the first exemplary structure according to the first embodiment of the present disclosure after formation of a collector-side trench and an emitter-side trench.

Referring to FIG. 4, an anisotropic etch is performed to remove exposed portions of the top germanium layer 60L selective to the dielectric materials of the extrinsic base cap 62, the dielectric spacer 76, and the shallow trench isolation structure 22. An emitter-side trench 69 is formed in the emitter side area ESA, and a collector-side trench 29 in the collector side area CSA. The combination of the extrinsic base cap 62, the dielectric spacer 76, and the shallow trench isolation structure 22 is employed as the etch mask for this anisotropic etch. The top surface of the buried insulator layer 12 is exposed at the bottom of the emitter-side trench 69 and the collector-side trench 29. The remaining portion of the top germanium layer 60L after the anisotropic etch constitutes a base 60 of a heterojunction bipolar transistor (HBT) to be formed. The sidewalls of the base 60 are vertically coincident with the outer sidewalls of the dielectric spacer 76, i.e., coincide when viewed in a vertical direction.

The base 60 contacts a top surface of the buried insulator layer 12 and including single crystalline germanium having a doping of a first conductivity type. The base 60 consists essentially of germanium and dopants of the first conductivity type. The extrinsic base 60B contacts a center portion of a top surface of the base 60B, and includes a polycrystalline semiconductor material having a doping of the first conductivity type. The dielectric spacer 76 laterally surrounds the stack of the extrinsic base 60B and the extrinsic base cap 62, and contacts a peripheral portion of the top surface of the base 60.

Figure 5:
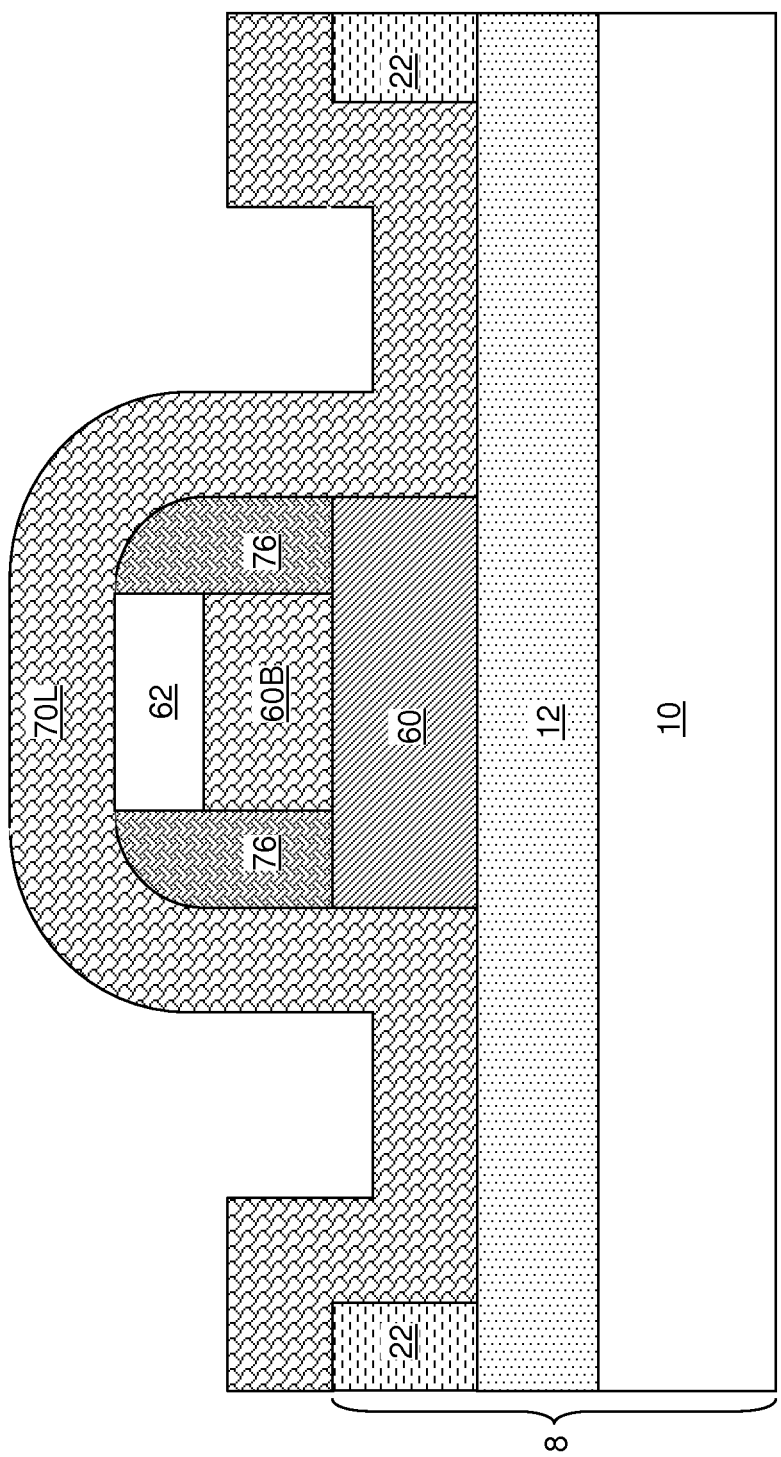
FIG. 5 is a vertical cross-sectional view of the first exemplary structure according to the first embodiment of the present disclosure after formation of a doped polysilicon layer.

Referring to FIG. 5, a doped polysilicon layer 70L is deposited, for example, by chemical vapor deposition. The doped polysilicon layer 70L can be formed over the extrinsic base cap 62 and the dielectric spacer 76 and the shallow trench isolation structure 22 and within the emitter-side trench 29 and the collector-side trench 69 as a conformal layer having substantially the same thickness on vertical portions and horizontal portions.

The doped polysilicon layer 70L has a doping of a second conductivity type, which is the opposite of the first conductivity type. For example, if the first conductivity type is p-type, the second conductivity type is n-type, and vice versa. The doped polysilicon layer 70L consists essentially of polysilicon and dopants of the second conductivity type. Typical p-type dopants include B, Ga, and In, and typical n-type dopants include P, As, and Sb. The concentration of dopants of the second conductivity type in the doped polysilicon layer 70L can be from $1.0\times10^{19}/cm^3$ to $2.0\times10^{21}/cm^3$, and typically from $1.0\times10^{20}/cm^3$ to $1.0\times10^{21}/cm^3$, although lesser and greater dopant concentrations can also be employed. The thickness of the doped polysilicon layer 70L, as measured from the top surface of the buried insulator layer 12 to a planar top surface of the emitter that is most proximal to the buried insulator layer 12, can be from 50 nm to 500 nm, and typically from 100 nm to 300 nm, although lesser and greater thicknesses can also be employed.

Figure 6:
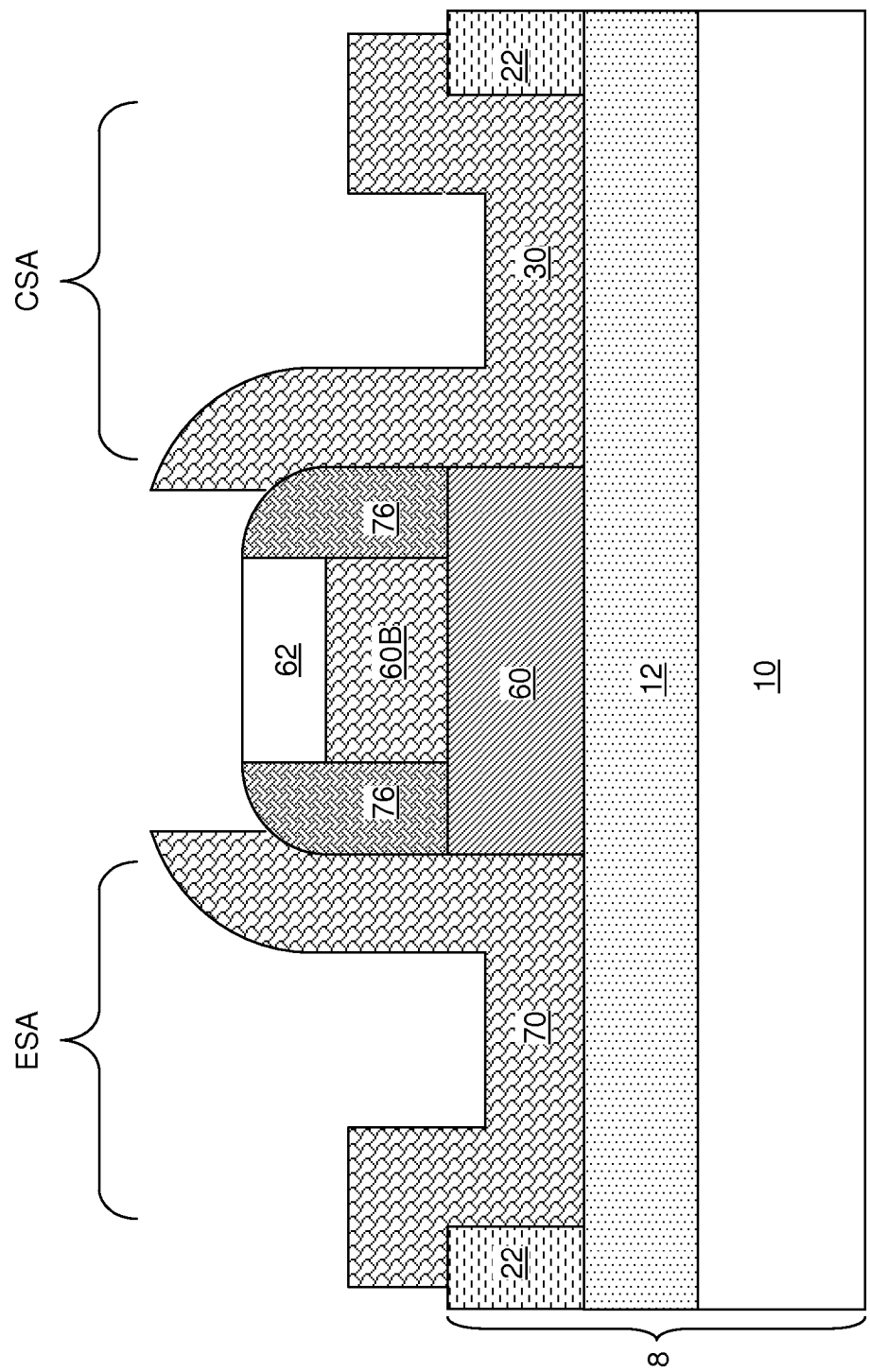
FIG. 6 is a vertical cross-sectional view of the first exemplary structure according to the first embodiment of the present disclosure after patterning of the doped polysilicon layer to form an emitter and a collector.

Referring to FIG. 6, the doped polysilicon layer 70L is lithographically patterned, for example, by applying a photoresist (not shown), lithographically patterning the photoresist, and transferring the pattern in the photoresist to the underlying doped polysilicon layer 70L by an etch that employs the photoresist as an etch mask. The photoresist is subsequently removed. A first remaining portion of the doped polysilicon layer 70L forms the emitter 70, and a second remaining portion of the doped polysilicon layer 70L forms a collector 30. The emitter 70 is formed in an area that includes at least in the emitter side area ESA, and the collector 30 is formed in an area that includes at least the collector side area CSA. Each of the emitter 70 and the collector 30 contacts the top surface of the buried insulator layer 12. The emitter 70 contacts a sidewall of the base 60 located at a periphery of the emitter side area ESA, and the collector 30 contacts a sidewall of the base 60 located at a periphery of the collector side area CSA. Each of the emitter 70 and the collector 30 includes doped polysilicon having a doping of the second conductivity type.

Figure 7:
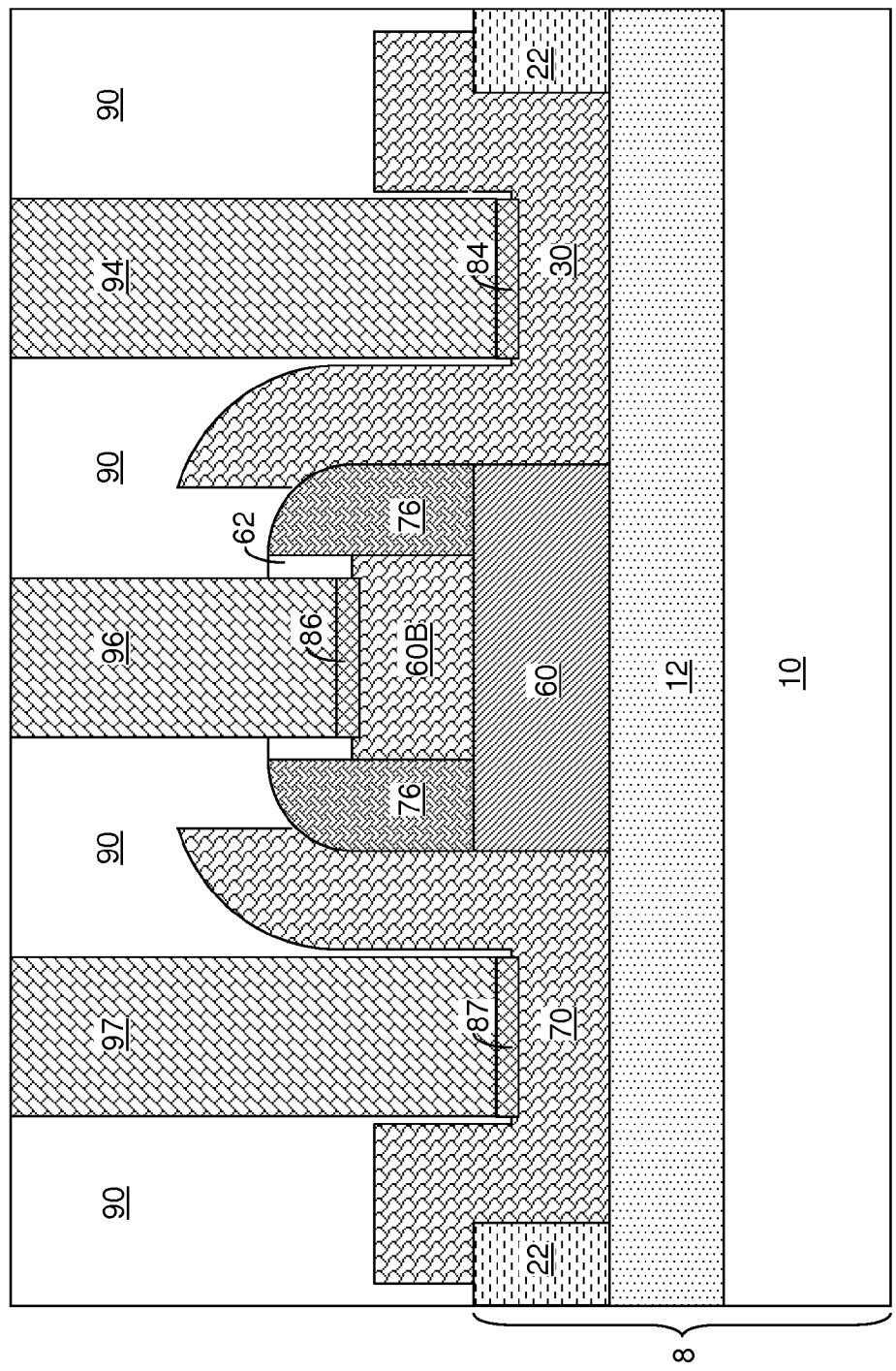
FIG. 7 is a vertical cross-sectional view of the first exemplary structure according to the first embodiment of the present disclosure after formation of a contact-level dielectric material layer and various contact via structures.

Referring to FIG. 7, a contact-level dielectric material layer 90 is deposited over the stack of the extrinsic base 60B and the extrinsic base cap 62, the dielectric spacer 76, the emitter 70, the collector 30, and the shallow trench isolation structure 22. The contact-level dielectric material layer 90 includes a dielectric material such as silicon oxide, silicon nitride, organosilicate glass, or any other dielectric material that can be employed for forming metal interconnect structures as known in the art. For example, the contact-level dielectric material layer 90 can be deposited by chemical vapor deposition or spin coating.

Various contact via structures are formed in the contact-level dielectric material layer 90L to provide electrical contacts to the collector 30, the base 60, and the emitter 70. Optionally, metal-semiconductor alloy portions such as a collector-side metal-semiconductor alloy portion 84, a base-side metal-semiconductor alloy portion 86, and an emitter-side metal-semiconductor alloy portion 87 can be formed after formation of via holes in the contact-level dielectric material layer 90 and through the extrinsic base cap 62. The metal-semiconductor alloy portions (84, 86, 87) can be formed, for example, by deposition of a metal layer, formation of metal silicides and metal germanide during an anneal at an elevated temperature, and removal of unreacted portions of the metal layer. The collector-side metal-semiconductor alloy portion 84 is a metal silicide, the emitter-side metal-semiconductor alloy portion 87 is another metal silicide, and the base-side metal-semiconductor alloy portion 86 can be a metal silicide, a metal germanide, or a metal germanosilicide depending on the composition of the doped semiconductor material in the extrinsic base 60B.

The various contact via structures can be formed by filling the via holes in the contact-level dielectric material layer 90 with a conductive material followed by removal of excess conductive material above the contact-level dielectric material layer 90. The various contact via structures include an emitter contact via structure 97 conductively connected to the emitter 70 and embedded in the contact-level dielectric material layer 90, a base contact via structure 96 conductively connected to the base 60 and embedded in the contact-level dielectric material layer 90, and a collector contact via structure 94 conductively connected to the collector 30 and embedded in the contact-level dielectric material layer 90. As used herein, a first element is conductively connected to a second element if there exists a conductive current path between the first element and the second element. Specifically, the emitter contact via structure 97 directly contacts the emitter 70 or is conductively connected to the emitted 70 via the emitter-side metal-semiconductor alloy portion 87. The base contact via structure 96 is conductively connected to the base 60 through the extrinsic base 60B and optionally through the base-side metal-semiconductor alloy portion 86. The collector contact via structure 94 directly contacts the collector 30 or is conductively connected to the collector 30 through the collector-side metal-semiconductor alloy portion 84.

The first exemplary structure includes a heterojunction bipolar transistor (HBT) structure in which the emitter 70 and the base 60 have different semiconductor materials. In the operation of bipolar transistor, for a given emitter-base forward bias, the collector current is proportional to exp $(-Eg_{base}/kT)$, where $Eg_{base}$ is the energy bandgap of the base region. Thus, a small base bandgap leads to large collector current. The base current is proportional to $\exp(-Eg_{emitter}/kT)$, where $Eg_{emitter}$ is the energy bandgap of the emitter region. Thus a large emitter energy bandgap leads to small base current. Germanium, with a bandgap of 0.66 eV, is excellent as the narrow-gap base material. Polysilicon, with a bandgap of about 1.12 eV and compatible with modern very large scale integration (VLSI) technology, is an excellent wide-gap emitter material.

The heterojunction bipolar transistor (HBT) of the present disclosure employs a wide-gap emitter and a narrow-gap base. Specifically, the HBT of the present disclosure employs a single crystalline germanium base to provide a narrow-gap base and a polysilicon emitter to provide a wide-gap emitter. The HBT of the present disclosure is superior for low-voltage operation in comparison with prior art bipolar transistors because of the differences in the bandgap between the material of the base and the material of the emitter.

As an example, consider trying to obtain a collector current density of 10 mA/μm². A usual bipolar transistor having a single crystalline silicon base and a polysilicon emitter needs a emitter-base forward bias of 0.92 V. If the silicon base is replaced with a single crystalline SiGe alloy with 20% of Ge in atomic concentration to provide a usual SiGe-base transistor having an energy bandgap of 200 meV smaller than the energy bandgap of silicon, the required emitter-base bias is about 0.72 V. For the HBT of the present disclosure having a single crystalline germanium base and a polysilicon emitter, the corresponding voltage required for providing collector current density of 10 mA/μm² is only 0.46 V.

Figure 8:
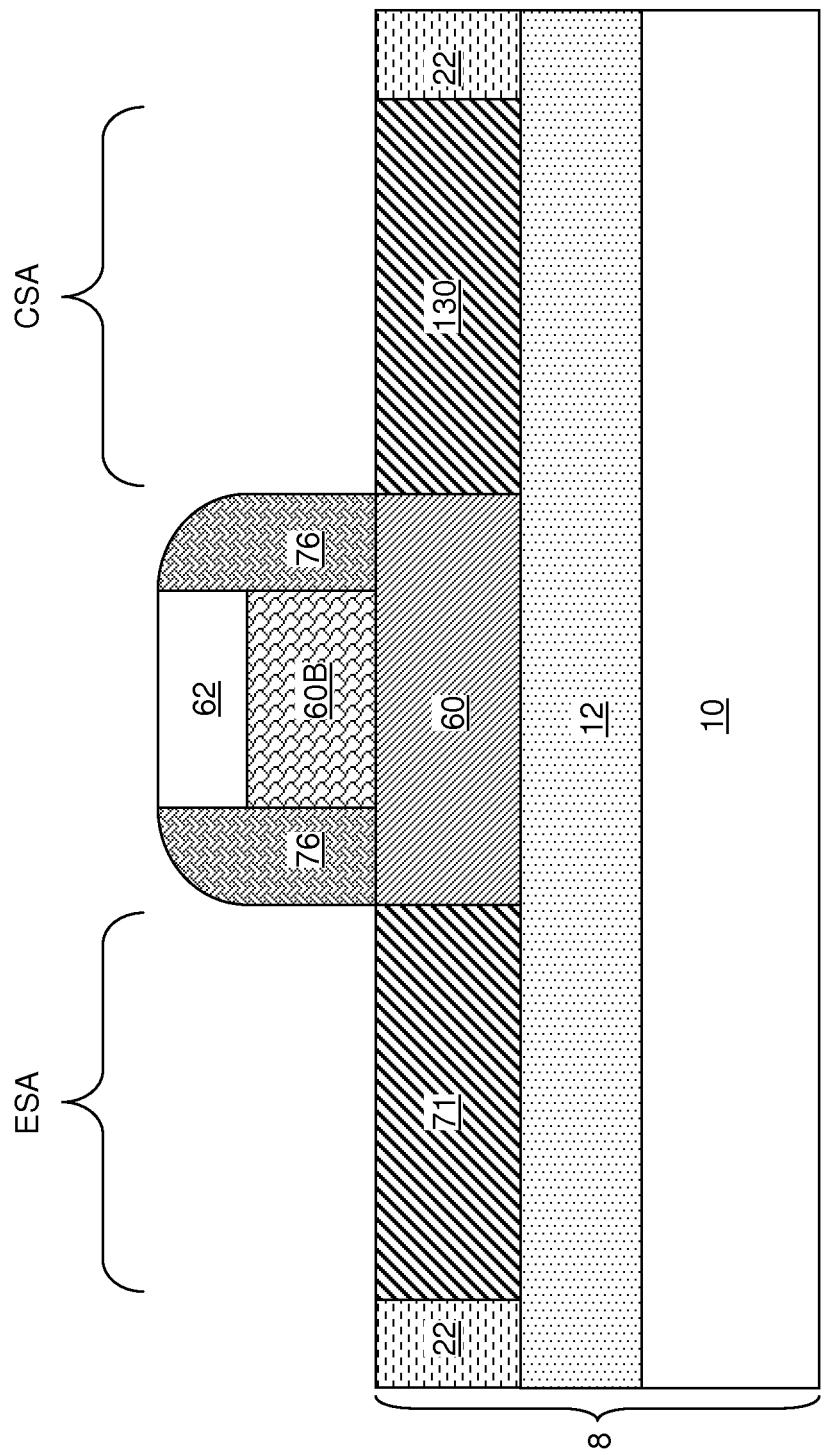
FIG. 8 is a vertical cross-sectional view of a second exemplary structure according to a second embodiment of the present disclosure after implantation of dopants of a second conductivity type to form a disposable emitter-side structure and a collector.

Referring to FIG. 8, a second exemplary structure according to a second embodiment of the present disclosure can be derived from the first exemplary structure of FIG. 3 by implanting dopants of the second conductivity type into portions of the top germanium layer 60L that is not masked by the stack of the extrinsic base 60B and the extrinsic base cap 62 and the dielectric spacer 76. In the second embodiment, the thickness of the extrinsic base cap 62 is preferably greater than the thickness of the top germanium layer 60L so that dopants of the second conductivity type are not implanted through the extrinsic base cap 62, i.e., the dopants of the second conductivity type do not pass through the interface between the extrinsic base 60B and the extrinsic base cap 62, but are implanted into the extrinsic base cap 62.

The implanted portion of the top germanium layer 60L in the emitter side area ESA forms a disposable emitter-side structure 71, and the implanted portion of the top germanium layer 60L in the collector-side area forms a collector 130. The disposable emitter-side structure 71 and the collector 130 have a doping of the first conductivity type at a dopant concentration from $1.0\times10^{15}/cm^3$ to $5.0\times10^{19}/cm^3$, and typically from $1.0\times10^{16}/cm^3$ to $1.0\times10^{19}/cm^3$, although lesser and greater dopant concentrations can also be employed. A vertical interface between the disposable emitter-side structure 71 and the base 60 is vertically coincident with an outer sidewall of the dielectric spacer 76, and a vertical interface between the collector 130 and the base 60 is vertically coincident with another outer sidewall of the dielectric spacer 76.

The base 60 contacts a top surface of the buried insulator layer 12 and including single crystalline germanium having a doping of a first conductivity type. The base 60 consists essentially of germanium and dopants of the first conductivity type. The extrinsic base 60B contacts a center portion of a top surface of the base 60B, and includes a polycrystalline semiconductor material having a doping of the first conductivity type. The dielectric spacer 76 laterally surrounds the stack of the extrinsic base 60B and the extrinsic base cap 62, and contacts a peripheral portion of the top surface of the base 60.

Figure 9:
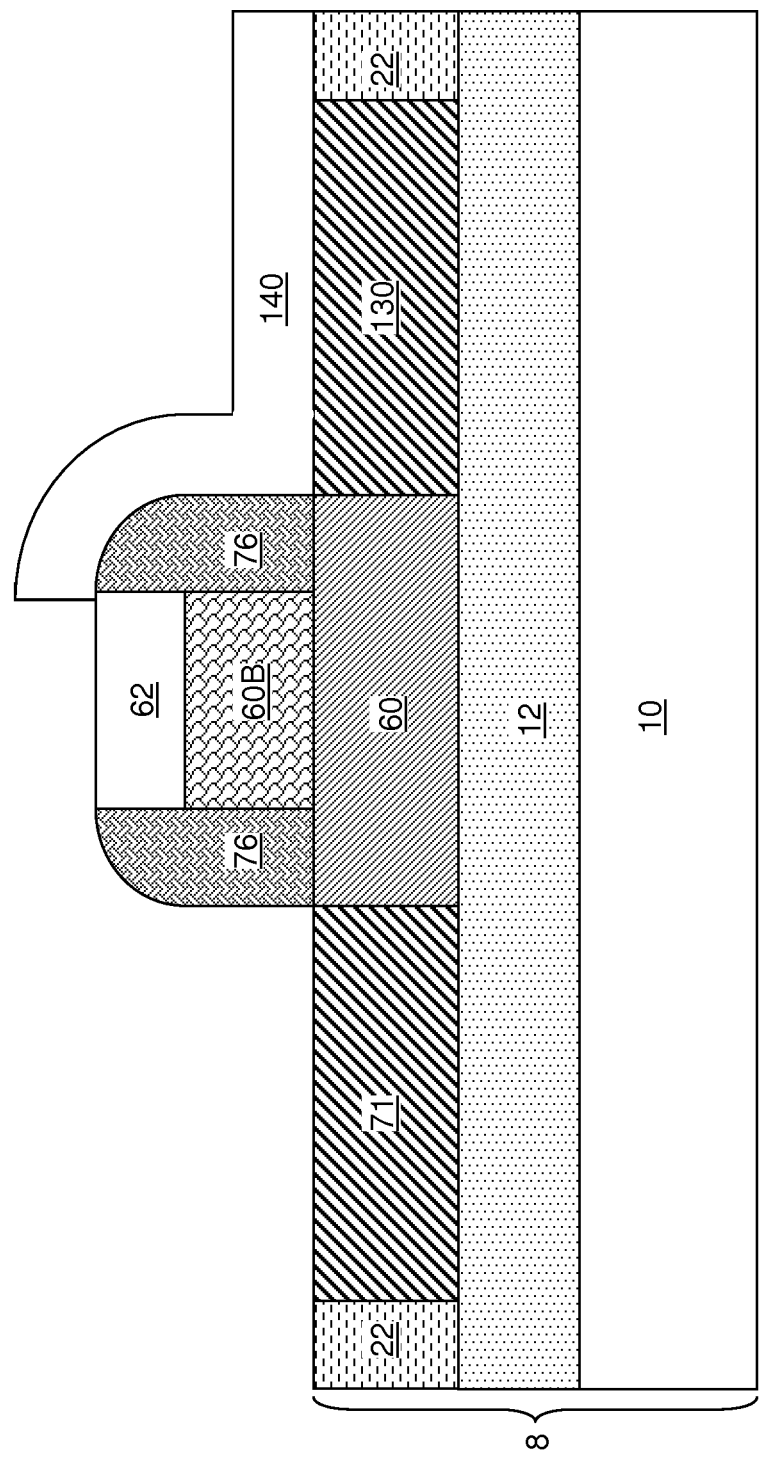
FIG. 9 is a vertical cross-sectional view of the second exemplary structure according to the second embodiment of the present disclosure after formation of a dielectric masking layer and patterning thereof.

Referring to FIG. 9, a dielectric masking layer 140 is deposited over the stack of the extrinsic base 60B and the extrinsic base cap 62, the dielectric spacer 76, the disposable emitter-side structure 71, the collector 130, and the shallow trench isolation structure 22. The dielectric masking layer 140 includes a dielectric material such as silicon oxide, silicon nitride, and/or silicon oxynitride. The dielectric masking layer 140 can be deposited, for example, by chemical vapor deposition. The thickness of the dielectric masking layer 140 at a horizontal portion can be from 5 nm to 50 nm, and typically from 10 nm to 25 nm, although lesser and greater thicknesses can also be employed.

The dielectric masking layer 140 is lithographically patterned to cover the collector 130, while exposing the top surface of the disposable emitter-side structure 71. After patterning of the dielectric masking layer 140, a sidewall of the dielectric masking layer 140 can be located over the extrinsic base cap 62 or over the dielectric spacer 76.

Figure 10:
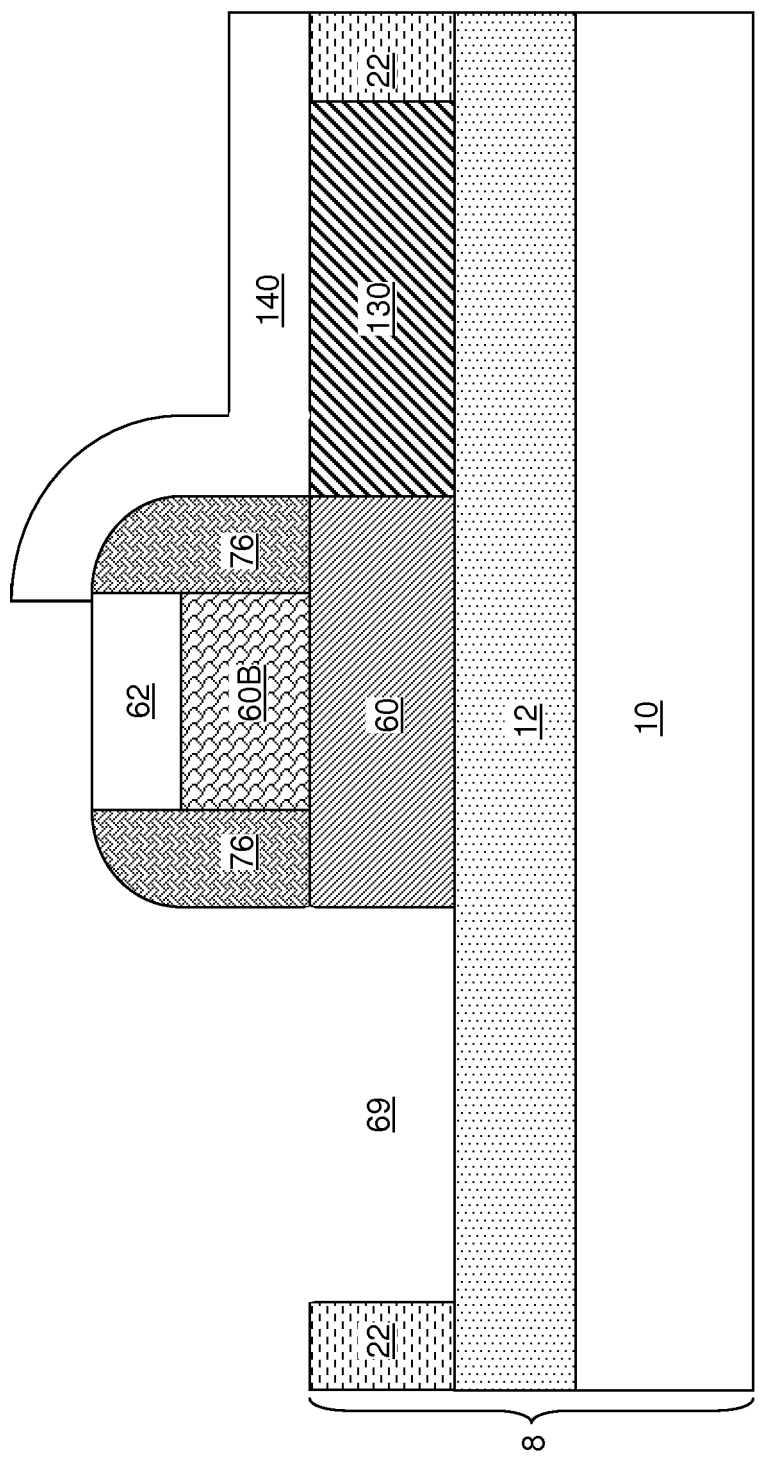
FIG. 10 is a vertical cross-sectional view of the second exemplary structure according to the second embodiment of the present disclosure after formation of an emitter-side trench.

Referring to FIG. 10, an emitter-side trench 69 is formed by anisotropically etching the disposable emitter-side structure 71 employing the combination of the extrinsic base cap 62, the dielectric spacer 76, the dielectric masking layer 140, and the shallow trench isolation structure as an etch mask. A sidewall of the emitter-side trench 69 is vertically coincident with an outer sidewall of the dielectric spacer 76. The top surface of the buried insulator layer 12 is exposed under the emitter-side trench 69.

Figure 11:
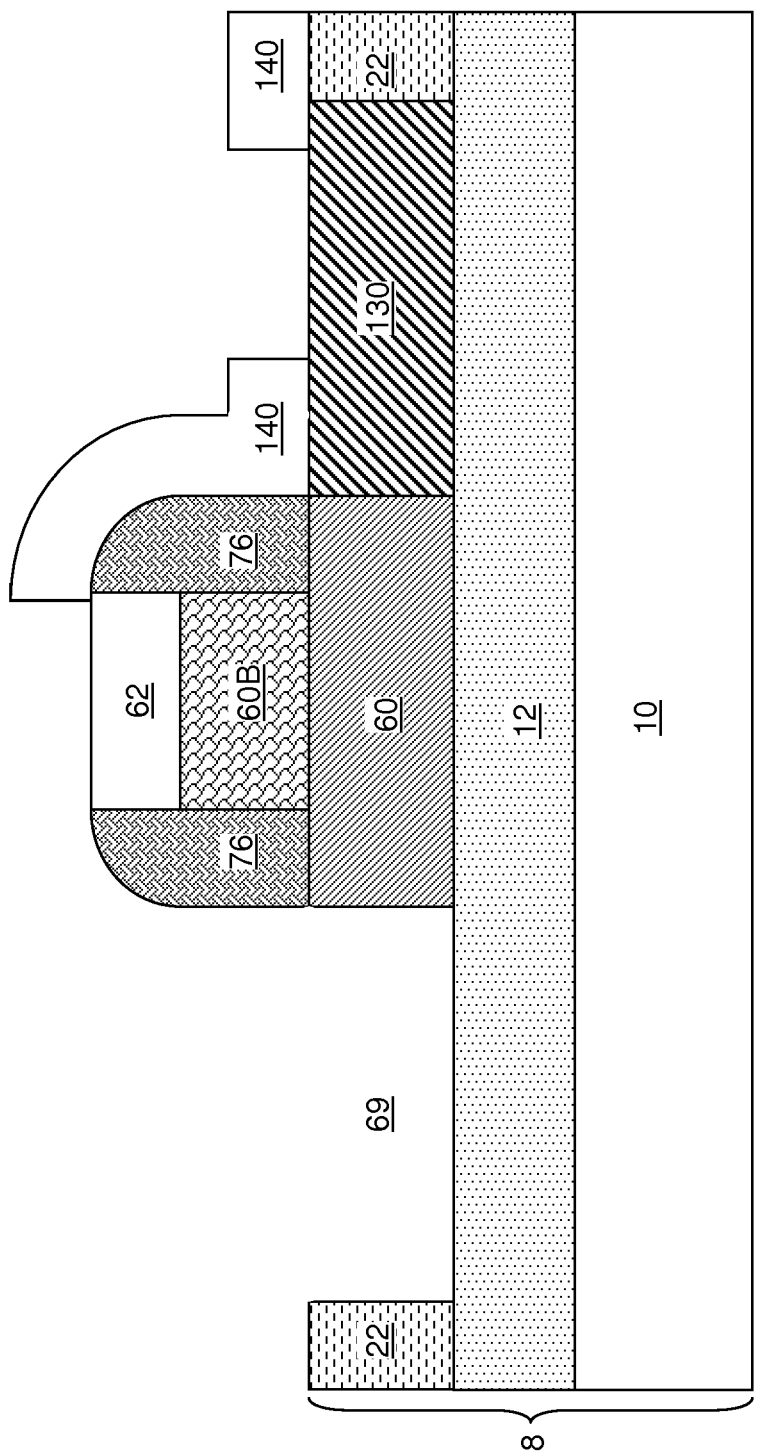
FIG. 11 is a vertical cross-sectional view of the second exemplary structure according to the second embodiment of the present disclosure after formation of an opening in the dielectric masking layer above the collector.

Referring to FIG. 11, a photoresist (not shown) is applied over the second exemplary structure and is lithographically patterned to form an opening over a portion of the collector 130. The pattern in the photoresist is transferred into the dielectric masking layer 140, for example, by an anisotropic etch to expose a top surface of the collector 130. The photoresist is subsequently removed, for example, by ashing.

Figure 12:
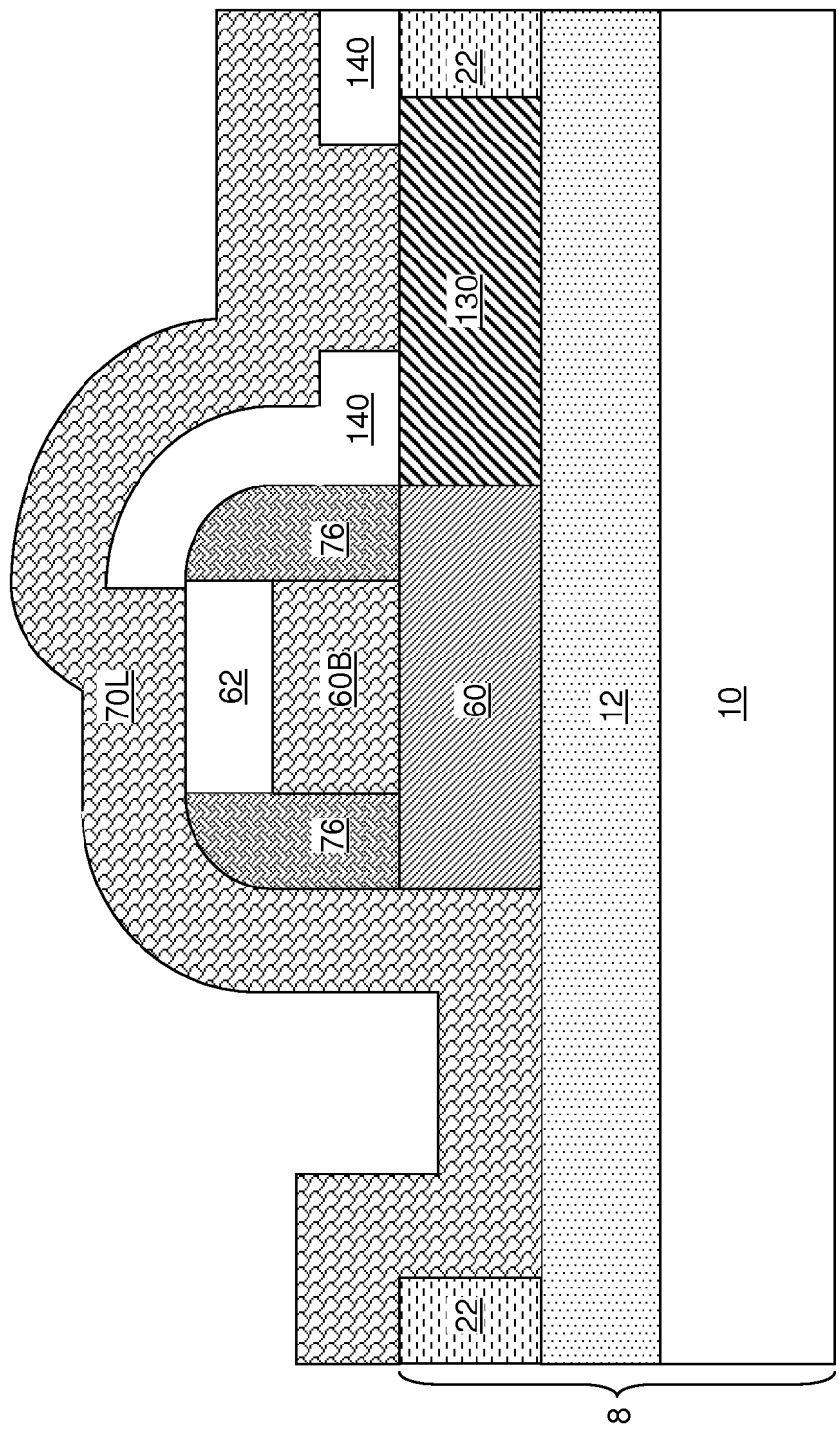
FIG. 12 is a vertical cross-sectional view of the second exemplary structure according to the second embodiment of the present disclosure after formation of a doped polysilicon layer.

Referring to FIG. 12, a doped polysilicon layer 70L is deposited, for example, by chemical vapor deposition. The doped polysilicon layer 70L can be formed over the extrinsic base cap 62, the dielectric spacer 76, the dielectric masking layer 140, and the shallow trench isolation structure 22 and within the emitter-side trench 69 as a conformal layer having substantially the same thickness on vertical portions and horizontal portions. The doped polysilicon layer 70L fills the opening in the dielectric masking layer 140 and contacts the collector 130.

The doped polysilicon layer 70L has a doping of the second conductivity type, which is the opposite of the first conductivity type. The doped polysilicon layer 70L consists essentially of polysilicon and dopants of the second conductivity type. The concentration of dopants of the second conductivity type in the doped polysilicon layer 70L can be from $1.0 \times 10^{19}/\text{cm}^3$ to $2.0 \times 10^{21}/\text{cm}^3$, and typically from $1.0 \times 10^{20}/\text{cm}^3$ to $1.0 \times 10^{21}/\text{cm}^3$, although lesser and greater dopant concentrations can also be employed. The thickness of the doped polysilicon layer 70L, as measured from the top surface of the buried insulator layer 12 to a planar top surface of the emitter that is most proximal to the buried insulator layer 12, can be from 50 nm to 500 nm, and typically from 100 nm to 300 nm, although lesser and greater thicknesses can also be employed.

Figure 13:
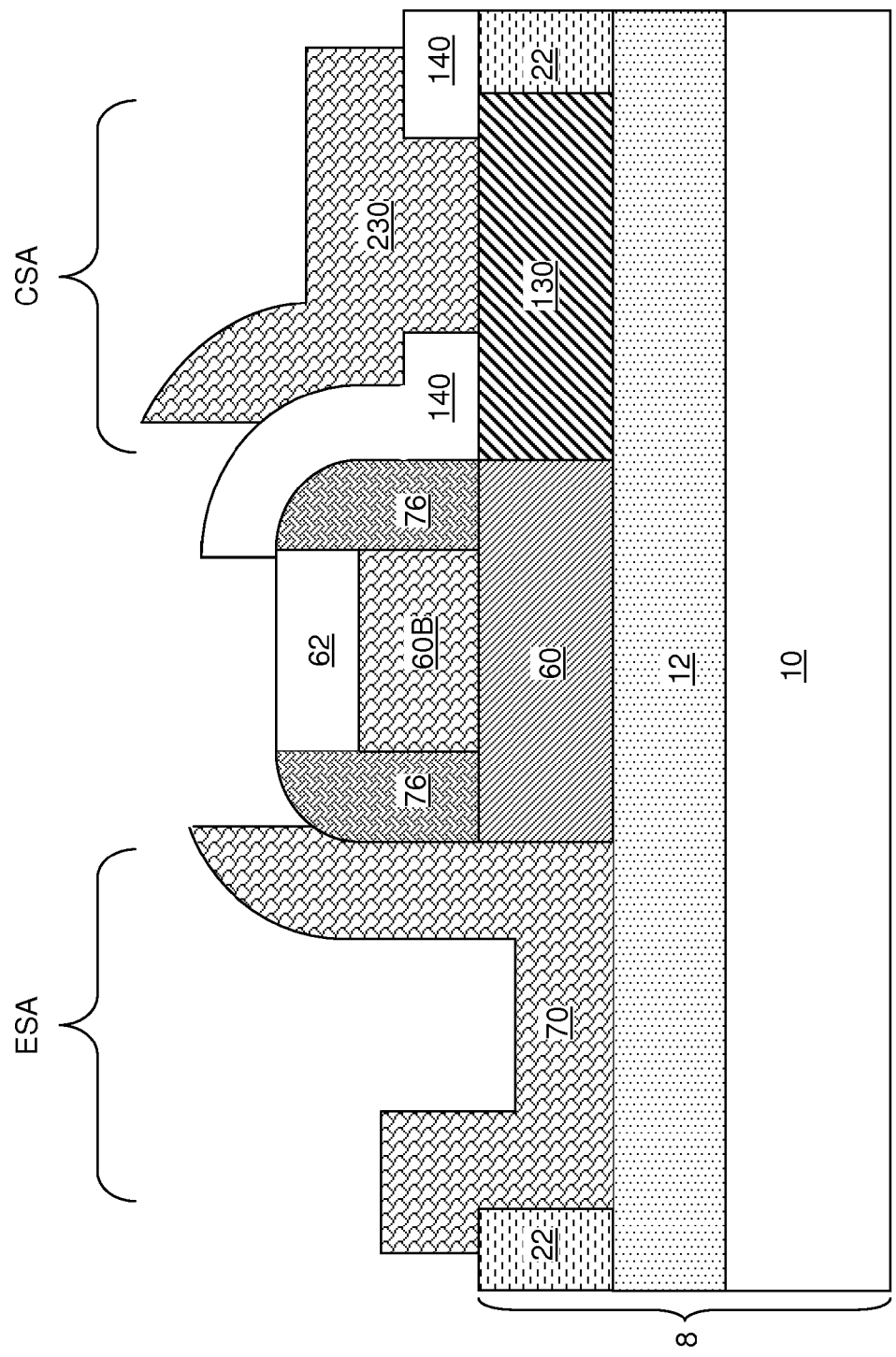
FIG. 13 is a vertical cross-sectional view of the second exemplary structure according to the second embodiment of the present disclosure after formation of an emitter and a doped polysilicon contact portion by patterning of the doped polysilicon layer.

Referring to FIG. 13, the doped polysilicon layer 70L is lithographically patterned, for example, by applying a photoresist (not shown), lithographically patterning the photoresist, and transferring the pattern in the photoresist in the underlying doped polysilicon layer 70L by an etch that employs the photoresist as an etch mask. The photoresist is subsequently removed. A first remaining portion of the doped polysilicon layer 70L forms the emitter 70, and a second remaining portion of the doped polysilicon layer 70L forms a doped polysilicon contact portion 230 having a doping of the second conductivity type and contacting the collector 130. The emitter 70 is formed in an area that includes at least in the emitter side area ESA, and the doped polysilicon contact portion 230 is formed in an area that includes at least the collector side area CSA. The emitter 70 contacts the top surface of the buried insulator layer 12. The doped polysilicon contact portion 230 contacts a top surface of the collector 130. The emitter 70 contacts a sidewall of the base 60 located at a periphery of the emitter side area ESA. The doped polysilicon contact portion 230 is spaced from the dielectric spacer 76 by the dielectric masking layer 140. Each of the emitter 70 and the doped polysilicon contact portion 230 includes doped polysilicon having a doping of the second conductivity type.

Figure 14:
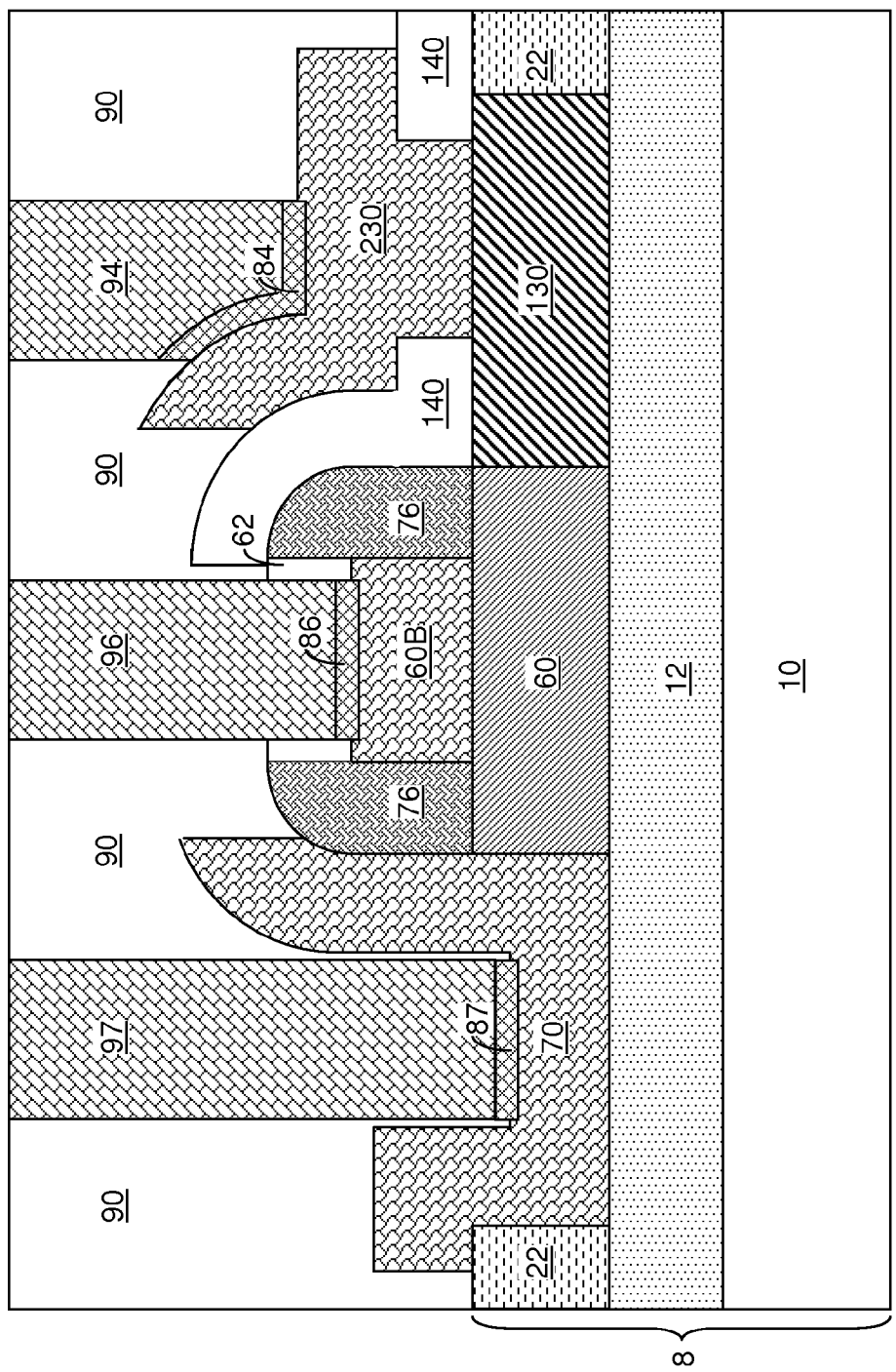
FIG. 14 is a vertical cross-sectional view of the second exemplary structure according to the second embodiment of the present disclosure after formation of a contact-level dielectric material layer and various contact via structures therein.

Referring to FIG. 14, a contact-level dielectric material layer 90 is deposited over the stack of the extrinsic base 60B and the extrinsic base cap 62, the dielectric spacer 76, the emitter 70, the doped polysilicon contact portion 230, and the shallow trench isolation structure 22. The contact-level dielectric material layer 90 can include the same material as in the first embodiment, and can be formed by the same methods as in the first embodiment.

Various contact via structures are formed in the contact-level dielectric material layer 90L to provide electrical contacts to the collector 130, the base 60, and the emitter 70. Optionally, metal-semiconductor alloy portions such as a collector-side metal-semiconductor alloy portion 84, a base-side metal-semiconductor alloy portion 86, and an emitter-side metal-semiconductor alloy portion 87 can be formed after formation of via holes in the contact-level dielectric material layer 90 and through the extrinsic base cap 62. The metal-semiconductor alloy portions (84, 86, 87) can be formed, for example, by deposition of a metal layer, formation of metal silicides and metal germanides during an anneal at an elevated temperature, and removal of unreacted portions of the metal layer. The collector-side metal-semiconductor alloy portion 84 is a metal silicide, the emitter-side metal-semiconductor alloy portion 87 is another metal silicide, and the base-side metal-semiconductor alloy portion 86 can be a metal silicide, a metal germanide, or a metal germanosilicide depending on the composition of the doped semiconductor material in the extrinsic base 60B.

The various contact via structures can be formed by filling the via holes in the contact-level dielectric material layer 90 with a conductive material followed by removal of excess conductive material above the contact-level dielectric material layer 90. The various contact via structures include an emitter contact via structure 97 conductively connected to the emitter 70 and embedded in the contact-level dielectric material layer 90, a base contact via structure 96 conductively connected to the base 60 and embedded in the contact-level dielectric material layer 90, and a collector contact via structure 94 conductively connected to the collector 130 and embedded in the contact-level dielectric material layer 90. Specifically, the emitter contact via structure 97 directly contacts the emitter 70 or is conductively connected to the emitted 70 via the emitter-side metal-semiconductor alloy portion 87. The base contact via structure 96 is conductively connected to the base 60 through the extrinsic base 60B and optionally through the base-side metal-semiconductor alloy portion 86. The collector contact via structure 94 is conductively connected to the collector 130 through the doped polysilicon contact portion 230 and optionally through the collector-side metal-semiconductor alloy portion 84. The HBT structure in the second exemplary structure can provide the same functional advantage as the HBT structure in the first exemplary structure. Furthermore, the doping concentration in the collector 130 can be optimized according to the collector-base junction breakdown voltage requirement of the application. A lower doping concentration in the collector 130 leads to a larger collector-base junction breakdown voltage, but it may also result in a slower speed of the transistor.

Figure 15:
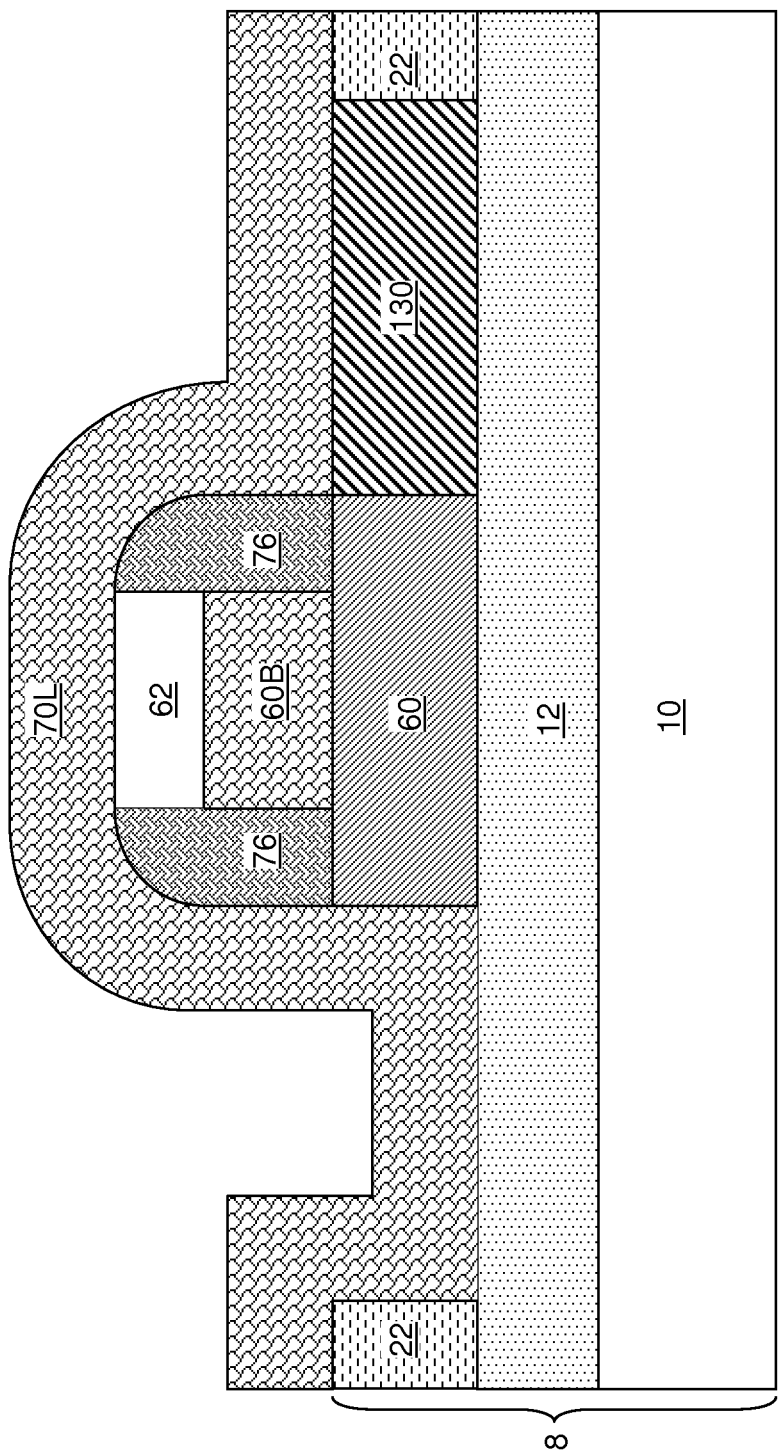
FIG. 15 is a vertical cross-sectional view of a third exemplary structure according to a third embodiment of the present disclosure after formation of a doped polysilicon layer.

Referring to FIG. 15, a third exemplary structure according to a third embodiment of the present disclosure is derived from the second exemplary structure of FIG. 8 by forming an emitter-side trench 69 employing the same processing step as in FIG. 10 without forming a dielectric masking layer 140 illustrated in FIGS. 9 and 10. Thus, a photoresist (not shown) can be applied over the second exemplary structure of FIG. 8 and lithographically patterned to form an opening in the emitter side area ESA. The periphery of the opening in the photoresist can overlie the extrinsic base cap 62 and the portion of the shallow trench isolation structure 22 around the emitter side area ESA. The disposable emitter-side structure 71 is etched to form an emitter-side trench 69 as illustrated in FIG. 10. However, a dielectric masking layer of FIG. 10 is not present in the third exemplary structure at this step.

A doped polysilicon layer 70L having the same composition and thickness as in the second embodiment can be deposited employing the same deposition methods. The doped polysilicon layer 70L can be formed over the extrinsic base cap 62, the dielectric spacer 76, the collector 130, and the shallow trench isolation structure 22 and within the emitter-side trench 69 as a conformal layer having substantially the same thickness on vertical portions and horizontal portions. The doped polysilicon layer 70L has a doping of the second conductivity type.

Figure 16:
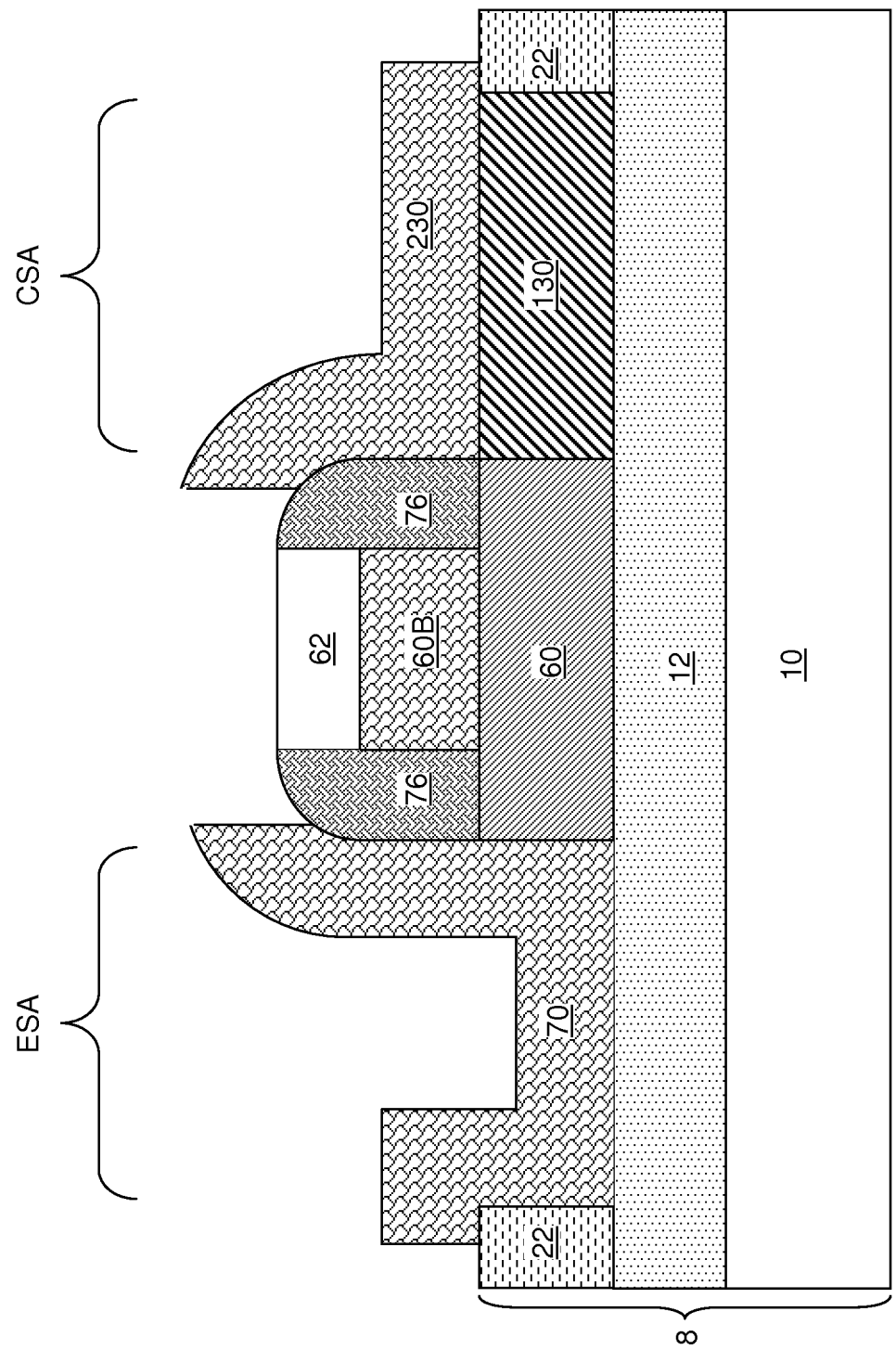
FIG. 16 is a vertical cross-sectional view of the third exemplary structure according to the third embodiment of the present disclosure after formation of an emitter and a doped polysilicon contact portion by patterning the doped polysilicon layer.

Referring to FIG. 16, the doped polysilicon layer 70L is lithographically patterned, for example, by applying a photoresist (not shown), lithographically patterning the photoresist, and transferring the pattern in the photoresist in the underlying doped polysilicon layer 70L by an etch that employs the photoresist as an etch mask. The photoresist is subsequently removed. A first remaining portion of the doped polysilicon layer 70L forms the emitter 70, and a second remaining portion of the doped polysilicon layer 70L forms a doped polysilicon contact portion 230 having a doping of the second conductivity type and contacting the collector 30. The emitter 70 is formed in an area that includes at least in the emitter side area ESA, and the doped polysilicon contact portion 230 is formed in an area that includes at least the collector side area CSA. The emitter 70 contacts the top surface of the buried insulator layer 12. The doped polysilicon contact portion 230 contacts the entirety of the top surface of the collector 130. The emitter 70 contacts a sidewall of the base 60 located at a periphery of the emitter side area ESA. The doped polysilicon contact portion 230 contacts the dielectric spacer 76. Each of the emitter 70 and the doped polysilicon contact portion 230 includes doped polysilicon having a doping of the second conductivity type.

Figure 17:
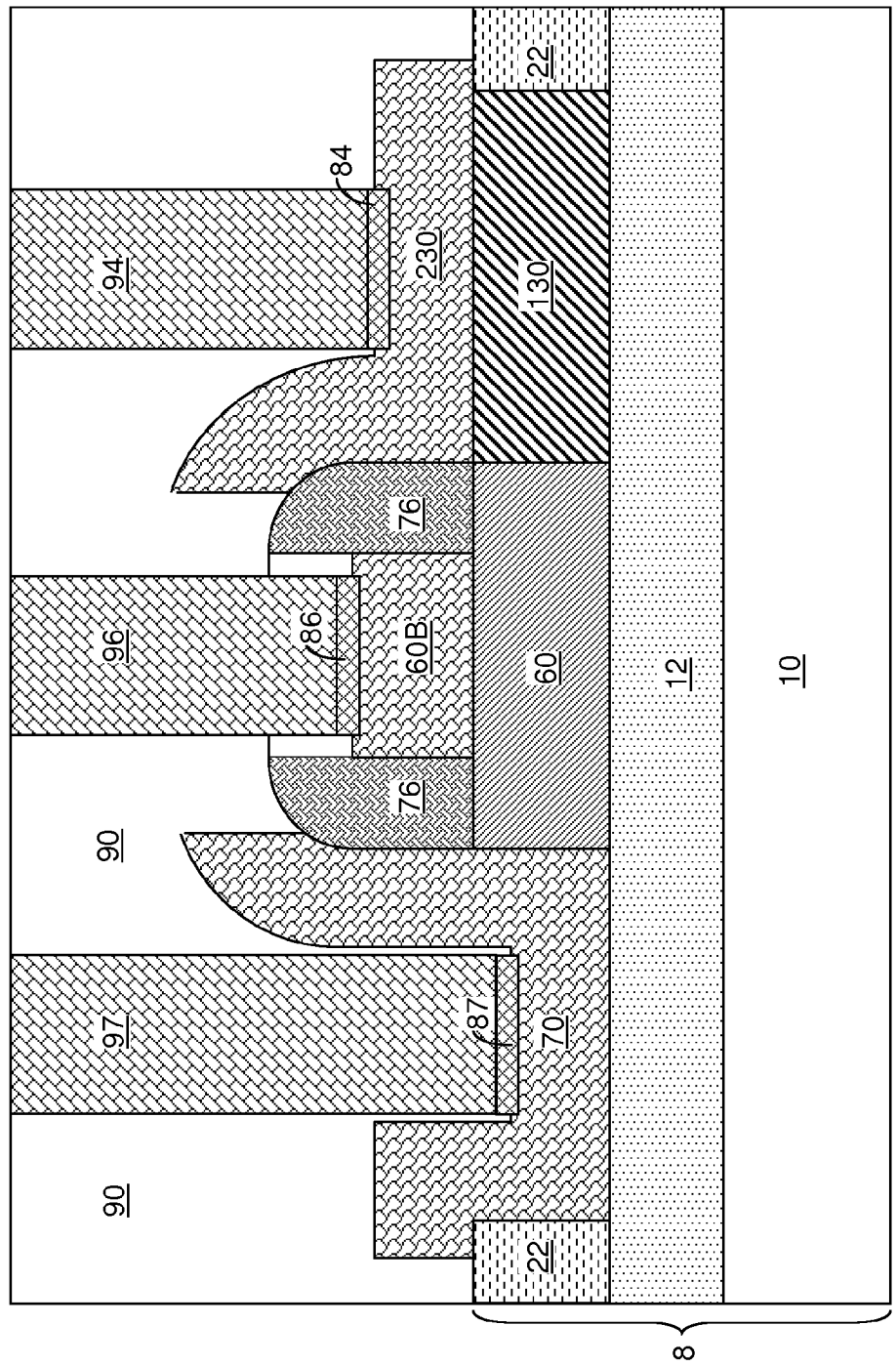
FIG. 17 is a vertical cross-sectional view of the third exemplary structure according to the third embodiment of the present disclosure after formation of a contact-level dielectric material layer and various contact via structures therein.

Referring to FIG. 17, a contact-level dielectric material layer 90 is deposited over the stack of the extrinsic base 60B and the extrinsic base cap 62, the dielectric spacer 76, the emitter 70, the doped polysilicon contact portion 230, and the shallow trench isolation structure 22. The contact-level dielectric material layer 90 can include the same material as in the first embodiment, and can be formed by the same methods as in the first embodiment.

Various contact via structures are formed in the contact-level dielectric material layer 90L in the same manner as in the first and second embodiments to provide electrical contacts to the collector 130, the base 60, and the emitter 70. Optionally, metal-semiconductor alloy portions such as a collector-side metal-semiconductor alloy portion 84, a base-side metal-semiconductor alloy portion 86, and an emitter-side metal-semiconductor alloy portion 87 can be formed after formation of via holes in the contact-level dielectric material layer 90 and through the extrinsic base cap 62. The collector-side metal-semiconductor alloy portion 84 is a metal silicide, the emitter-side metal-semiconductor alloy portion 87 is another metal silicide, and the base-side metal-semiconductor alloy portion 86 can be a metal silicide, a metal germanide, or a metal germanosilicide depending on the composition of the doped semiconductor material in the extrinsic base 60B.

The various contact via structures include an emitter contact via structure 97 conductively connected to the emitter 70 and embedded in the contact-level dielectric material layer 90, a base contact via structure 96 conductively connected to the base 60 and embedded in the contact-level dielectric material layer 90, and a collector contact via structure 94 conductively connected to the collector 130 and embedded in the contact-level dielectric material layer 90. Specifically, the emitter contact via structure 97 directly contacts the emitter 70 or is conductively connected to the emitted 70 via the emitter-side metal-semiconductor alloy portion 87. The base contact via structure 96 is conductively connected to the base 60 through the extrinsic base 60B and optionally through the base-side metal-semiconductor alloy portion 86. The collector contact via structure 94 is conductively connected to the collector 130 through the doped polysilicon contact portion 230 and optionally through the collector-side metal-semiconductor alloy portion 84. The HBT structure in the third exemplary structure can provide the same functional advantage as the HBT structure in the first exemplary structure. Furthermore, the doping concentration in the collector 130 can be optimized according to the collector-base junction breakdown voltage requirement of the application. A lower doping concentration in the collector 130 leads to a larger collector-base junction breakdown voltage, but it may also result in a slower speed of the transistor.

Figure 18:
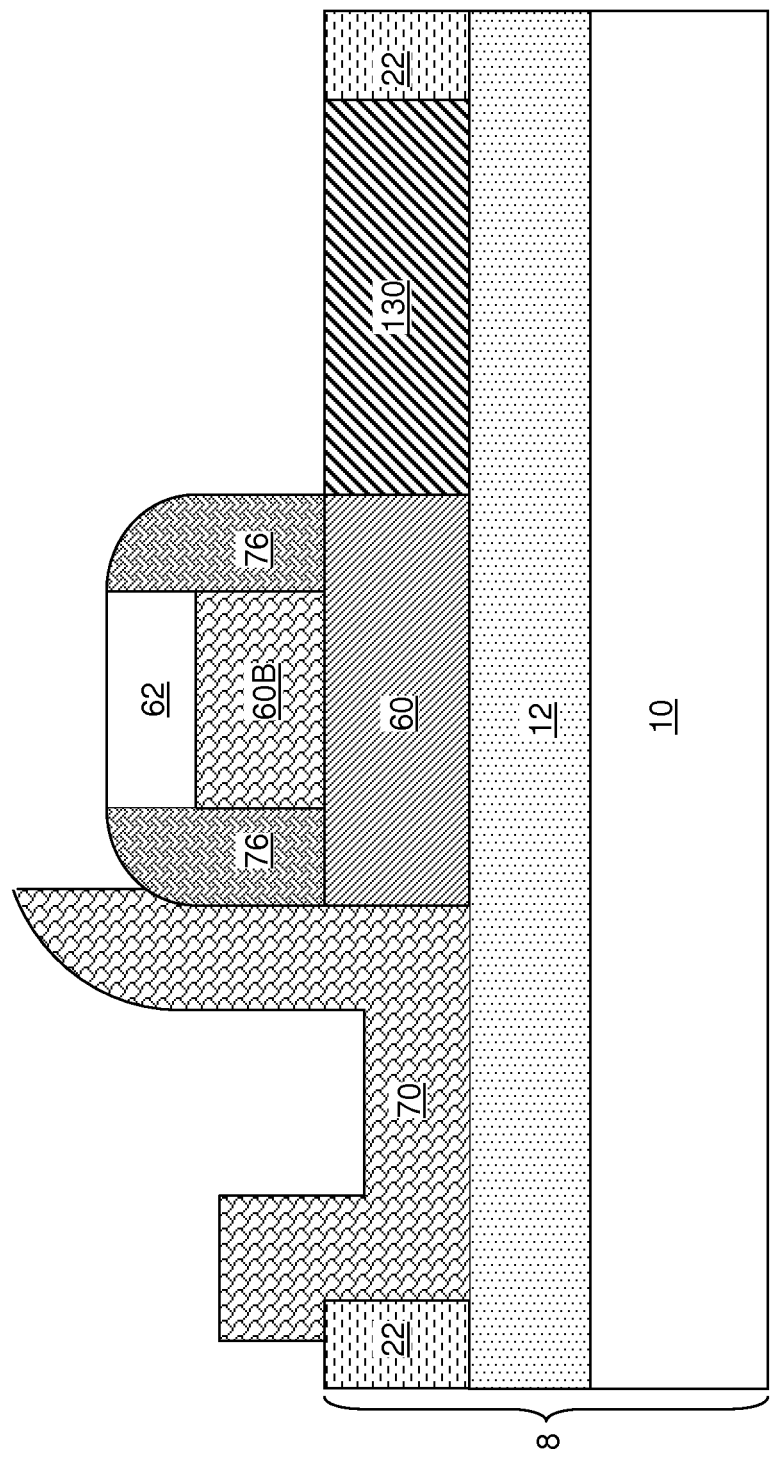
FIG. 18 is a vertical cross-sectional view of a fourth exemplary structure according to a fourth embodiment of the present disclosure after formation of an emitter by patterning the doped polysilicon layer.

Referring to FIG. 18, a fourth exemplary structure according to a fourth embodiment of the present disclosure is derived from the third exemplary structure of FIG. 15 by patterning the doped polysilicon layer 70L to form only an emitter 70 without forming any doped polysilicon contact portion 230 (See FIG. 16). Thus, the entirety of the top surface of the collector 130 is exposed after formation of the emitter 70.

Figure 19:
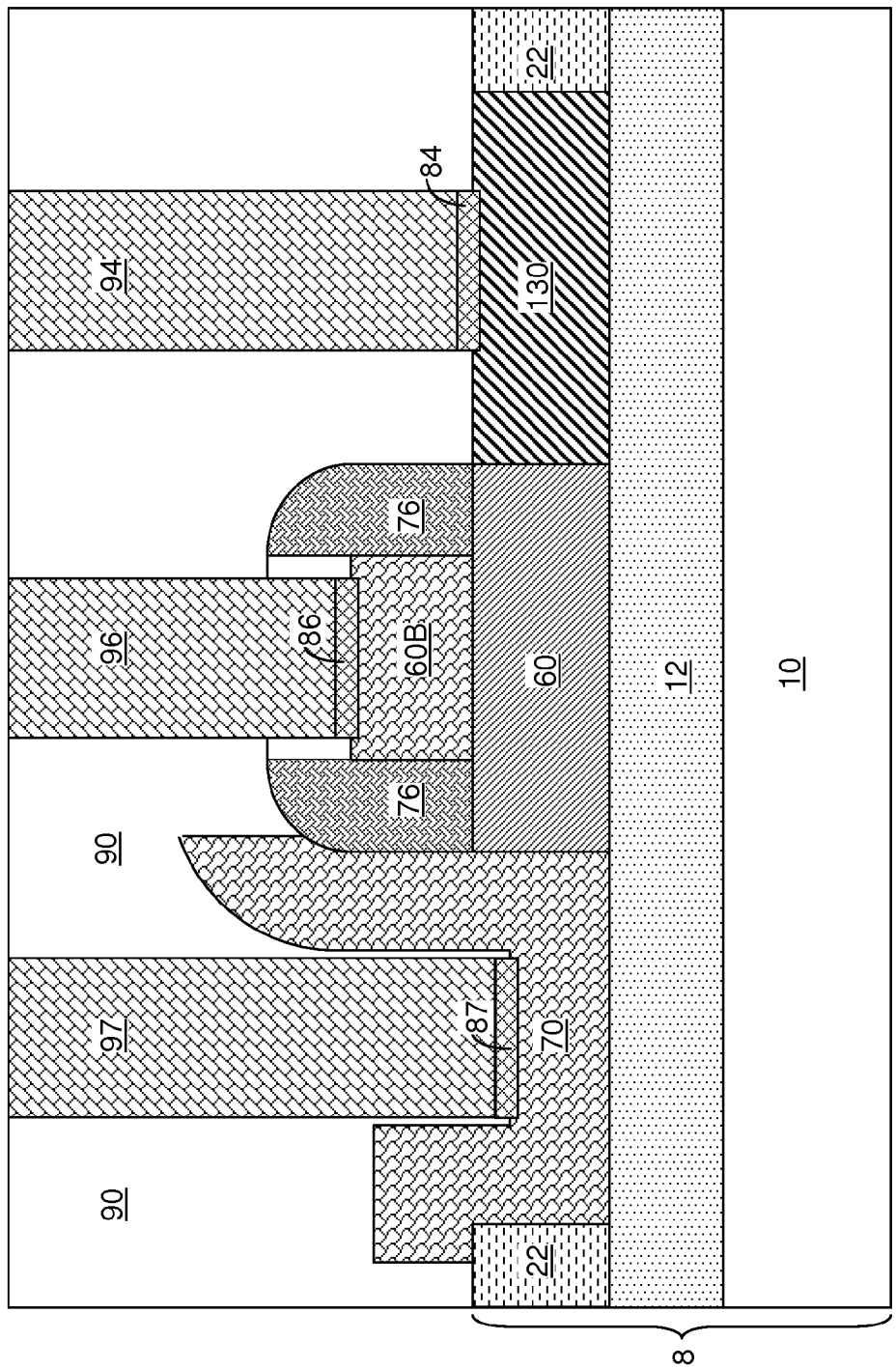
FIG. 19 is a vertical cross-sectional view of the fourth exemplary structure according to the fourth embodiment of the present disclosure after formation of a contact-level dielectric material layer and various contact via structures therein.

Referring to FIG. 19, a contact-level dielectric material layer 90 is deposited over the stack of the extrinsic base 60B and the extrinsic base cap 62, the dielectric spacer 76, the emitter 70, the collector 130, and the shallow trench isolation structure 22. The contact-level dielectric material layer 90 can include the same material as in the first embodiment, and can be formed by the same methods as in the first embodiment.

Various contact via structures are formed in the contact-level dielectric material layer 90L in the same manner as in the first and second embodiments to provide electrical contacts the collector 130, the base 60, and the emitter 70. Optionally, metal-semiconductor alloy portions such as a collector-side metal-semiconductor alloy portion 84, a base-side metal-semiconductor alloy portion 86, and an emitter-side metal-semiconductor alloy portion 87 can be formed after formation of via holes in the contact-level dielectric material layer 90 and through the extrinsic base cap 62. The collector-side metal-semiconductor alloy portion 84 is a metal germanide, the emitter-side metal-semiconductor alloy portion 87 is a metal silicide, and the base-side metal-semiconductor alloy portion 86 can be a metal silicide, a metal germanide, or a metal germanosilicide depending on the composition of the doped semiconductor material in the extrinsic base 60B.

The various contact via structures include an emitter contact via structure 97 conductively connected to the emitter 70 and embedded in the contact-level dielectric material layer 90, a base contact via structure 96 conductively connected to the base 60 and embedded in the contact-level dielectric material layer 90, and a collector contact via structure 94 conductively connected to the collector 30 and embedded in the contact-level dielectric material layer 90. Specifically, the emitter contact via structure 97 directly contacts the emitter 70 or is conductively connected to the emitted 70 via the emitter-side metal-semiconductor alloy portion 87. The base contact via structure 96 is conductively connected to the base 60 through the extrinsic base 60B and optionally through the base-side metal-semiconductor alloy portion 86. The collector contact via structure 94 directly contacts the collector 130 or is conductively connected to the collector 130 through the collector-side metal-semiconductor alloy portion 84. The HBT structure in the fourth exemplary structure can provide the same functional advantage as the HBT structure in the first exemplary structure. Furthermore, the doping concentration in the collector 130 can be optimized according to the collector-base junction breakdown voltage requirement of the application. A lower doping concentration in the collector 130 leads to a larger collector-base junction breakdown voltage, but it may also result in a slower speed of the transistor.

While this disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A heterojunction bipolar transistor (HBT) structure comprising:
   a substrate including a buried insulator layer;
   a base contacting a top surface of said buried insulator layer and including single crystalline germanium having a doping of a first conductivity type;
   an emitter contacting said top surface of said buried insulator layer and laterally contacting said base and comprising doped polysilicon having a doping of a second conductivity type that is the opposite of said first conductivity type;
   an extrinsic base contacting a center portion of a top surface of said base and comprising a polycrystalline semiconductor material having a doping of said first conductivity type; and
   a dielectric spacer laterally surrounding said extrinsic base and contacting a peripheral portion of said top surface of said base, wherein a vertical interface between said emitter and said base is vertically coincident with an outer sidewall of said dielectric spacer.

2. The HBT structure of claim 1, wherein said base has another vertical sidewall that is vertically substantially coincident with another outer sidewall of said dielectric spacer.

3. The HBT structure of claim 1, wherein said base consists essentially of germanium and dopants of said first conductivity type.

4. The HBT structure of claim 1, wherein said emitter consists essentially of polysilicon and dopants of said second conductivity type.

5. The HBT structure of claim 1, further comprising a shallow trench isolation structure contacting said top surface of said buried insulator layer, wherein a lower portion of said emitter is laterally surrounded by said shallow trench isolation structure and said base.

6. The HBT structure of claim 1, further comprising:
   a contact-level dielectric material layer overlying said emitter, said base, and a collector;
   an emitter contact structure conductively connected to said emitter and embedded in said contact-level dielectric material layer;
   a base contact structure conductively connected to said base and embedded in said contact-level dielectric material layer; and
   a collector contact structure conductively connected to said collector and embedded in said contact-level dielectric material layer.

7. The HBT structure of claim 1, wherein a vertical interface between said emitter and said dielectric spacer is vertically coincident with a p-n junction between single crystalline germanium of said first conductivity type and polysilicon of said second conductivity type.

8. The HBT structure of claim 1, further comprising a collector vertically contacting said top surface of said buried insulator layer and laterally contacting said base and including single crystalline germanium having a doping of said second conductivity type.

9. The HBT structure of claim 8, further comprising a doped polysilicon contact portion having a doping of said second conductivity type and contacting said collector.

10. The HBT structure of claim 9, further comprising:
    an extrinsic base contacting a center portion of a top surface of said base and comprising a polycrystalline semiconductor material having a doping of said first conductivity type; and
    a dielectric spacer laterally surrounding said extrinsic base and contacting a peripheral portion of said top surface of said base.

11. The HBT structure of claim 9, further comprising a dielectric masking layer having an opening therein, wherein said doped polysilicon contact portion is present within said opening.

12. The HBT structure of claim 9, wherein said doped polysilicon contact portion contacts an outer sidewall of said dielectric spacer.

13. The HBT structure of claim 1, further comprising a collector vertically contacting said top surface of said buried insulator layer and laterally contacting said base, said collector consisting essentially of polysilicon having a doping of said second conductivity type.

14. The HBT structure of claim 13, further comprising a shallow trench isolation structure contacting said top surface of said buried insulator layer, wherein said emitter overlies a first portion of said shallow trench isolation structure and said collector overlies a second portion of said shallow trench isolation structure.

15. The HBT structure of claim 13, further comprising:
    an extrinsic base contacting a center portion of a top surface of said base and comprising a polycrystalline semiconductor material having a doping of said first conductivity type; and
    a dielectric spacer laterally surrounding said extrinsic base and contacting a peripheral portion of said top surface of said base, wherein a portion of said emitter contacts a first outer sidewall of said dielectric spacer and a portion of said collector contacts a second outer sidewall of said dielectric spacer.

16. The HBT structure of claim 1, wherein said vertical interface between said emitter and said base is a p-n junction between single crystalline germanium of said first conductivity type and polysilicon of said second conductivity type.

17. The HBT structure of claim 16, wherein a vertical interface between said emitter and said dielectric spacer is vertically coincident with said vertical interface between said emitter and said base.

18. A heterojunction bipolar transistor (HBT) structure comprising:
a substrate including a buried insulator layer;
a base contacting a top surface of said buried insulator layer and consisting essentially of single crystalline germanium and dopants of a first conductivity type;
an emitter contacting said top surface of said buried insulator layer and laterally contacting said base and consisting essentially of polysilicon and dopants of a second conductivity type that is the opposite of said first conductivity type; and
a vertical interface between said emitter and said base that is a p-n junction between single crystalline germanium of said first conductivity type and polysilicon of said second conductivity type.

19. The HBT structure of claim 18, further comprising:
an extrinsic base contacting a center portion of a top surface of said base and comprising a polycrystalline semiconductor material having a doping of said first conductivity type; and
a dielectric spacer laterally surrounding said extrinsic base and contacting a peripheral portion of said top surface of said base, wherein said vertical interface between said emitter and said base is vertically coincident with an outer sidewall of said dielectric spacer.

20. The HBT structure of claim 19, wherein a vertical interface between said emitter and said dielectric spacer is vertically coincident with said vertical interface between said emitter and said base.

* * * * *